US012701806B2

(12) United States Patent
Wang et al.

(10) Patent No.: US 12,701,806 B2
(45) Date of Patent: Aug. 4, 2026

(54) SEMICONDUCTOR DEVICE AND METHOD OF MAKING

(71) Applicant: Taiwan Semiconductor Manufacturing Company Limited, Hsin-Chu (TW)

(72) Inventors: Wen-Sheng Wang, Hsin-Chu (TW); Yi-Hsuan Fan, New Taipei City (TW); Yen-Ting Chen, Changhua County (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 421 days.

(21) Appl. No.: 18/238,607

(22) Filed: Aug. 28, 2023

(65) Prior Publication Data

US 2025/0081650 A1 Mar. 6, 2025

(51) Int. Cl.
*H10F 39/00* (2025.01)
*H10F 39/18* (2025.01)

(52) U.S. Cl.
CPC ......... *H10F 39/807* (2025.01); *H10F 39/011* (2025.01); *H10F 39/18* (2025.01)

(58) Field of Classification Search
CPC ....... H10F 39/807; H10F 39/011; H10F 39/18
See application file for complete search history.

(56) References Cited

U.S. PATENT DOCUMENTS

| | | | | |
|---|---|---|---|---|
| 2007/0158771 A1* | 7/2007 | Hynecek | ............... | H10F 39/011 257/431 |
| 2009/0026510 A1* | 1/2009 | Lim | ...................... | H10F 39/807 257/292 |
| 2010/0110239 A1* | 5/2010 | Ramappa | .............. | H10F 39/802 348/E9.037 |
| 2013/0146747 A1* | 6/2013 | Hynecek | ............... | H10F 39/014 257/258 |

* cited by examiner

*Primary Examiner* — Errol V Fernandes
(74) *Attorney, Agent, or Firm* — Cooper Legal Group, LLC

(57) ABSTRACT

A semiconductor device is provided. The semiconductor device includes a substrate, a first epitaxial layer over the substrate, a first photodiode and a second photodiode in the first epitaxial layer, and a trench isolation structure between the first photodiode and the second photodiode. The first photodiode includes a first doped region having a first conductivity type. The first photodiode includes a second doped region, overlying the first doped region, having a second conductivity type different than the first conductivity type. The first photodiode includes a third doped region, overlying the first doped region, having the second conductivity type. A first distance between a sidewall of the third doped region and an uppermost surface of the first epitaxial layer is between about a hundredth to about a fifth of a second distance between a sidewall of the trench isolation structure and the uppermost surface of the first epitaxial layer.

20 Claims, 11 Drawing Sheets

100

100

100

100

SEMICONDUCTOR DEVICE AND METHOD OF MAKING

BACKGROUND

Semiconductor devices are used in a multitude of electronic devices, such as mobile phones, laptops, desktops, tablets, watches, gaming systems, and various other industrial, commercial, and consumer electronics. Semiconductor devices generally comprise semiconductor portions and wiring portions formed inside the semiconductor portions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
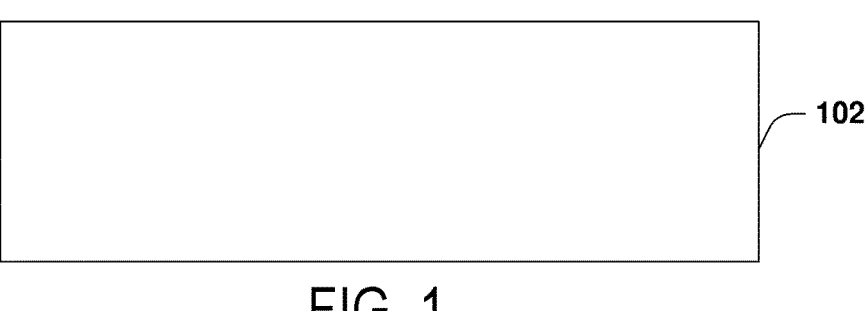
FIG. 1 illustrates a cross-sectional view of a semiconductor device at a stage of fabrication, in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

The term "overlying" and/or the like may be used to describe one element or feature being vertically coincident with and at a higher elevation than another element or feature. For example, a first element overlies a second element if the first element is at a higher elevation than the second element and at least a portion of the first element is vertically coincident with at least a portion of the second element.

The term "underlying" and/or the like may be used to describe one element or feature being vertically coincident with and at a lower elevation than another element or feature. For example, a first element underlies a second element if the first element is at a lower elevation than the second element and at least a portion of the first element is vertically coincident with at least a portion of the second element.

The term "over" may be used to describe one element or feature being at a higher elevation than another element or feature. For example, a first element is over a second element if the first element is at a higher elevation than the second element.

The term "under" may be used to describe one element or feature being at a lower elevation than another element or feature. For example, a first element is under a second element if the first element is at a lower elevation than the second element.

A semiconductor device has a substrate, a first epitaxial layer over the substrate, and a first photodiode and a second photodiode in the first epitaxial layer. In some embodiments, the semiconductor device includes a trench isolation structure between the first photodiode and the second photodiode. The first photodiode includes a first doped region having a first conductivity type. The first photodiode includes a second doped region, overlying the first doped region, having a second conductivity type different than the first conductivity type. The first photodiode includes a third doped region, overlying the first doped region, having the second conductivity type. A first sidewall of the third doped region is aligned with a first portion of a first sidewall of the trench isolation structure. In some embodiments, a first concentration of first dopants of the second conductivity type in the third doped region is greater than a second concentration of second dopants of the second conductivity type in the second doped region. In some embodiments, the third doped region at least one of prevents or mitigates generation of dark current in the semiconductor device, such as current that is generated when there is no incident radiation. In some embodiments, when dark current is generated in a semiconductor device, the dark current impacts, such as introduces noise to, measurements of a sensor implemented using the semiconductor device, thereby causing inaccuracies in a signal, such as an image, determined using the sensor. The sensor comprises at least one of an image sensor or a different type of sensor. By at least one of preventing or mitigating generation of dark current using the third doped region, the third doped region provides for improved accuracy and/or improved resolution of the sensor as compared to a semiconductor device that does not include the third doped region in the first photodiode.

A sidewall, such as a bottom sidewall, of the third doped region has a first depth relative to a surface of the semiconductor device. In some embodiments, the first depth is at most about a first threshold proportion relative to a trench isolation structure depth of the trench isolation structure. In some embodiments, the first threshold proportion is at least one of about 20%, about 10%, about 5%, or other suitable proportion. The sidewall of the third doped region having the first depth that is at most about the first threshold proportion relative to the trench isolation structure depth provides for at least one of (i) improved protection against generation of dark current in at least one of the first photodiode or the semiconductor device, or (ii) reduced generation of dark current in at least one of the first photodiode or the semiconductor device, as compared to an implementation in which the first depth is greater than the first threshold proportion relative to the trench isolation structure depth.

Figure 8:
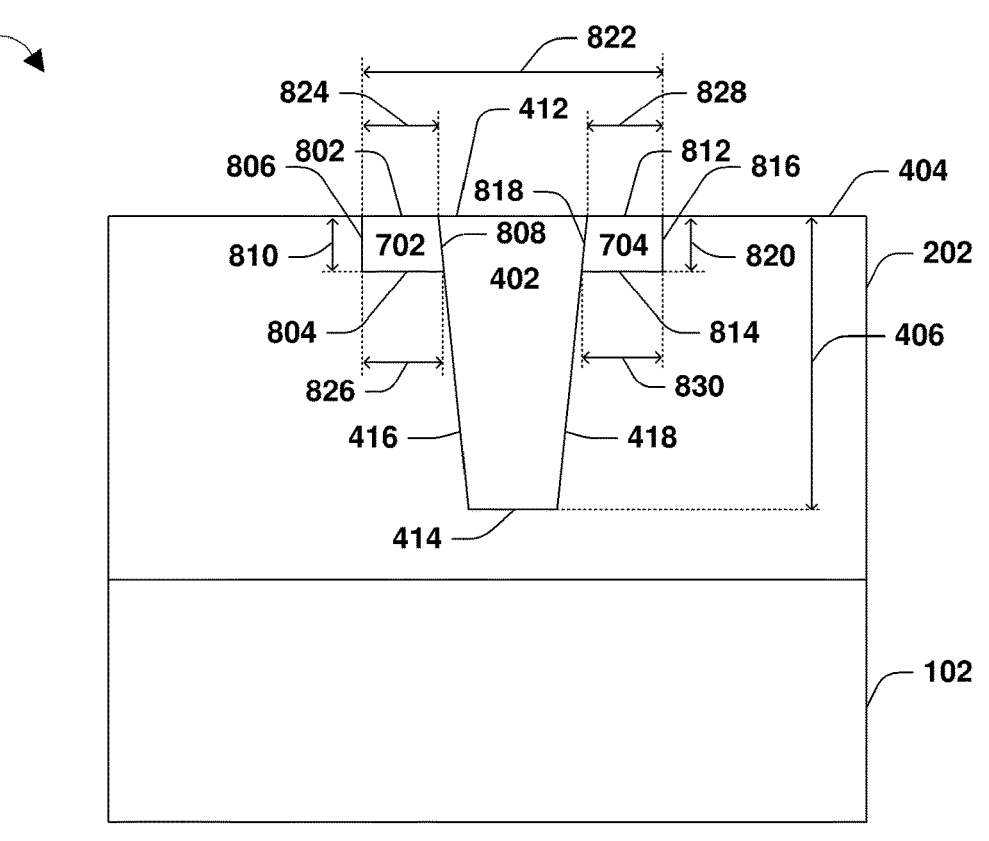
FIG. 8 illustrates a cross-sectional view of a semiconductor device at a stage of fabrication, in accordance with some embodiments.
Figure 9:
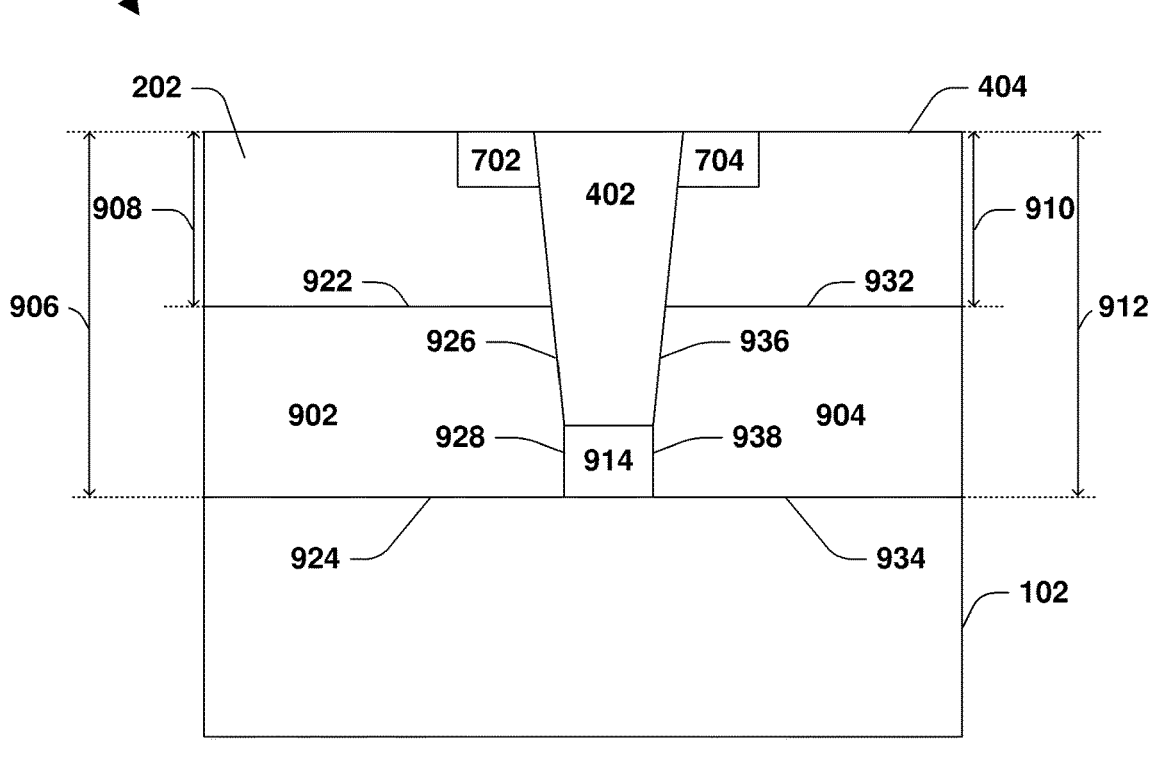
FIG. 9 illustrates a cross-sectional view of a semiconductor device at a stage of fabrication, in accordance with some embodiments.
Figure 10A:
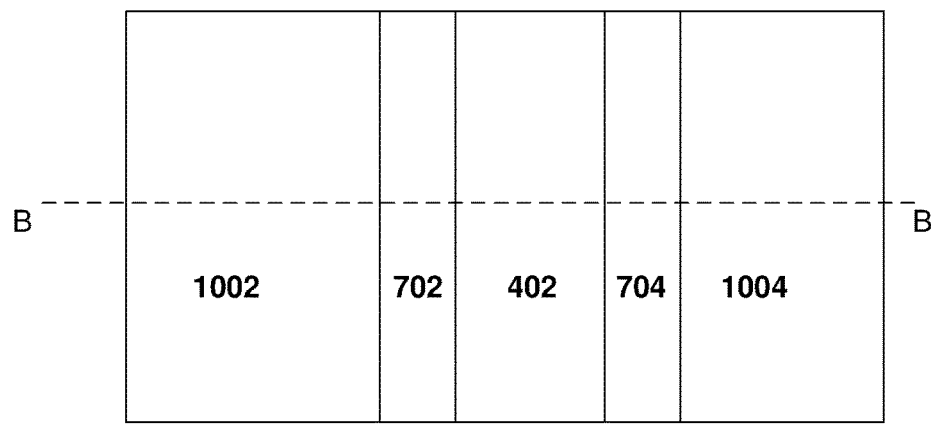
FIG. 10A illustrates a top view of a semiconductor device at a stage of fabrication, in accordance with some embodiments.
Figure 10B:
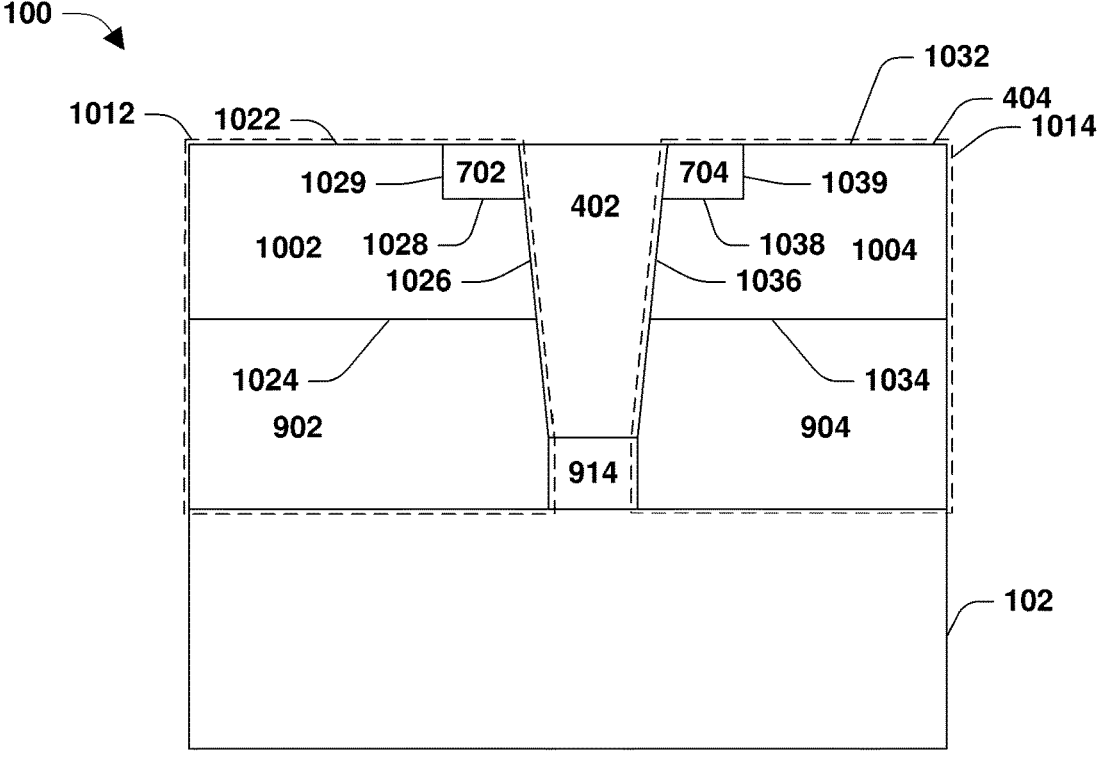
FIG. 10B illustrates a cross-sectional view a semiconductor device taken along line B-B of FIG. 10A, in accordance with some embodiments.

FIGS. 1-10B illustrate a semiconductor device 100 at various stages of fabrication, in accordance with some embodiments. FIGS. 1-9 illustrate cross-sectional views of the semiconductor device 100. FIG. 10A illustrates a top view of the semiconductor device 100, and FIG. 10B illustrates a cross-sectional view of the semiconductor device 100 taken along line B-B of FIG. 10A.

In some embodiments, a sensor is implemented via the semiconductor device 100. The sensor comprises at least one of an image sensor, a complementary metal-oxide-semiconductor (CMOS) image sensor, a backside CMOS image sensor, or another type of sensor. Other structures and/or configurations of the semiconductor device 100 and/or the sensor are within the scope of the present disclosure.

FIG. 1 illustrates the semiconductor device 100 according to some embodiments. The semiconductor device 100 comprises a substrate 102. The substrate 102 comprises at least one of an epitaxial layer, a silicon-on-insulator (SOI) structure, a wafer, or a die formed from a wafer. The substrate 102 comprises at least one of silicon, germanium, carbide, arsenide, gallium, arsenic, phosphide, indium, antimonide, SiGe, SiC, GaAs, GaN, GaP, InGaP, InP, InAs, InSb, GaAsP, AlInAs, AlGaAs, GaInAs, GaInP, GaInP, GaInAsP, or other suitable material. The substrate 102 comprises at least one of monocrystalline silicon, crystalline silicon with a <100> crystallographic orientation, crystalline silicon with a <110> crystallographic orientation, crystalline silicon with a <111> crystallographic orientation or other suitable material. Other structures and/or configurations of the substrate 102 are within the scope of the present disclosure.

In some embodiments, the substrate 102 comprises first dopants having a first conductivity type, such as n-type or p-type. In some embodiments, the first dopants comprise at least one of nitrogen (N), phosphorus (P), beryllium (Be), boron (B), aluminum (Al), gallium (Ga), or other dopant. In some embodiments, the first dopants are p-type dopants comprising at least one of boron dopants, aluminum dopants, gallium dopants, beryllium dopants, or other p-type dopants. In some embodiments, the first dopants are n-type dopants comprising at least one of nitrogen dopants, phosphorus dopants, or other n-type dopants. In some embodiments, the substrate 102 is doped with the first dopants by at least one of ion implantation, molecular diffusion, or other suitable techniques. In some embodiments, a depth of dopants of the first dopants in the substrate 102 is controlled by increasing or decreasing a voltage used to direct the dopants into the substrate 102. In some embodiments, a first dopant concentration of the first dopants in the substrate 102 is controlled by at least one of a quantity of implantation shots of one or more implantation shots performed to direct the first dopants into the substrate 102, an implantation dose an implantation shot of the one or more implantation shots, an implantation energy level of the implantation shot, or other suitable parameter.

Figure 2:
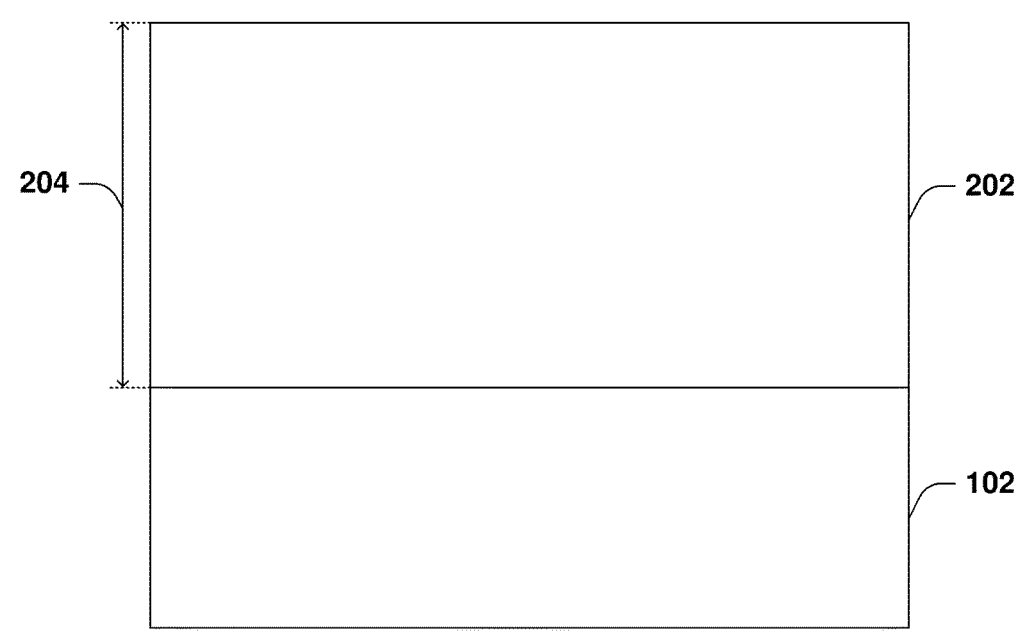
FIG. 2 illustrates a cross-sectional view of a semiconductor device at a stage of fabrication, in accordance with some embodiments.

FIG. 2 illustrates a first epitaxial layer 202 formed over the substrate 102, according to some embodiments. In some embodiments, the first epitaxial layer 202 is formed to have a first thickness 204. In some embodiments, the first epitaxial layer 202 is formed by a first epitaxial process, such as an epitaxial growth process. In some embodiments, the first epitaxial process includes at least one of molecular beam epitaxy, chemical vapor deposition (CVD), vapor-phase epitaxy (VPE), ultra-high vacuum CVD (UHV-CVD), growth, or other suitable process. In some embodiments, the first epitaxial process uses one or more precursors comprising at least one of a gas precursor, a vapor precursor, or a liquid precursor. In some embodiments, the one or more precursors interact with the substrate 102 during the first epitaxial process. Embodiments are contemplated in which the first epitaxial layer 202 is formed by at least one of physical vapor deposition (PVD), sputtering, CVD, plasma enhanced CVD (PECVD), low pressure CVD (LPCVD), atomic layer chemical vapor deposition (ALCVD), UHVCVD, reduced pressure CVD (RPCVD), atomic layer deposition (ALD), molecular beam epitaxy (MBE), liquid phase epitaxy (LPE), spin on, or other suitable techniques.

In some embodiments, the first epitaxial layer 202 is a doped layer, such as a doped epi layer. In some embodiments, the first epitaxial layer 202 comprises second dopants having the first conductivity type. In some embodiments, in the first epitaxial process, at least some of the second dopants having the first conductivity type travel from the substrate 102 to the first epitaxial layer 202. In some embodiments, at least some of the second dopants are introduced to the first epitaxial layer 202 via the first epitaxial process by at least one of (i) adding impurities to a source material of the first epitaxial process, (ii) using a dopant precursor in the first epitaxial process, or (iii) other suitable techniques. In some embodiments, at least some of the second dopants are introduced to the first epitaxial layer 202 after the first epitaxial process is performed, such as by at least one of ion implantation, molecular diffusion, or other suitable techniques.

In some embodiments, the first epitaxial layer 202 comprises at least one of silicon, germanium, carbide, arsenide, gallium, arsenic, phosphide, indium, antimonide, SiGe, SiC, GaAs, GaN, GaP, InGaP, InP, InAs, InSb, GaAsP, AlInAs, AlGaAs, GaInAs, GaInP, GaInAsP, or other suitable material. In some embodiments, the first epitaxial layer 202 is in direct contact with an uppermost surface of the substrate 102. The first epitaxial layer 202 is different than the substrate 102, such as having a different material composition, such that an interface is defined between the first epitaxial layer 202 and the substrate 102. In some embodiments, the first epitaxial layer 202 does not have a material composition different than the substrate 102. An interface is nevertheless defined between the first epitaxial layer 202 and the substrate 102 because the first epitaxial layer 202 and the substrate 102 are separate, different, etc. layers (e.g., one or more measurable properties exist at the interface that would not exist and/or would have different values in a continuous, single, etc. layer (e.g., roughness, smoothness, tension, compression, conductivity, resistivity, etc.). In some embodiments, the first epitaxial layer 202 is in indirect contact with the uppermost surface of the substrate 102, where one or more layers, such as a buffer layer, are between the first epitaxial layer 202 and the substrate 102. In some embodiments, a second dopant concentration of the second dopants in the first epitaxial layer 202 is greater than the first dopant concentration of the first dopants in the substrate 102. In some embodiments, the second dopant concentration is controlled by at least one of a parameter of the first epitaxial process or other suitable parameter.

Figures 3, 4:
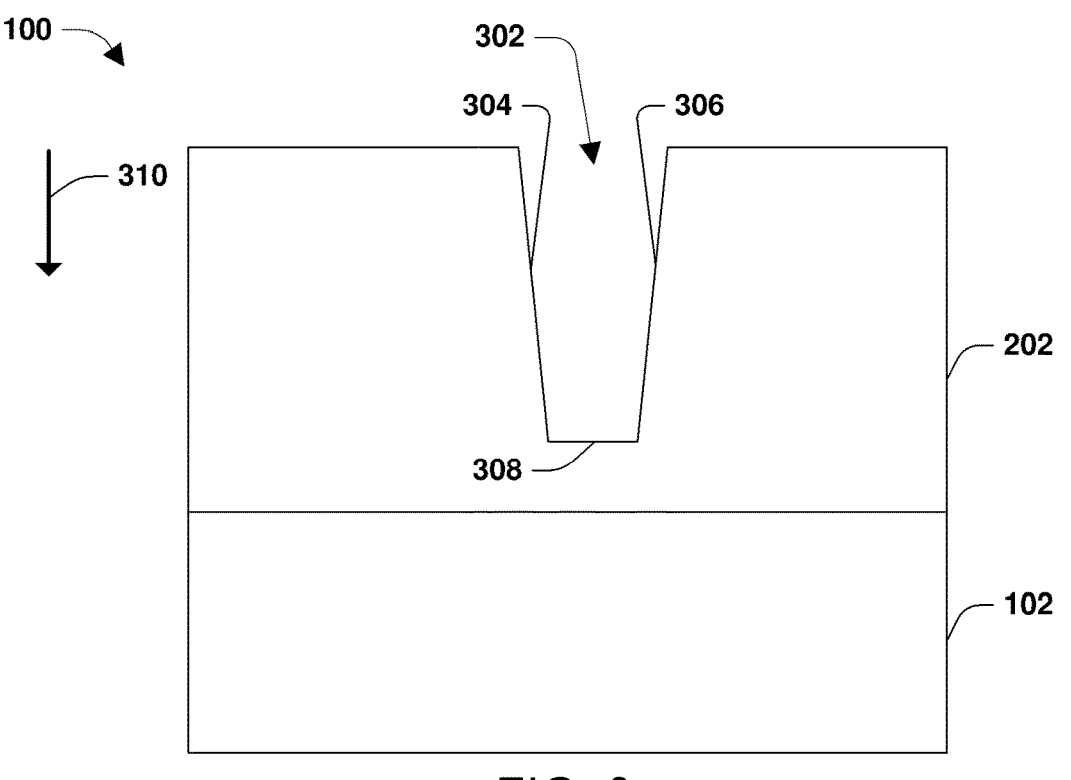
FIG. 3 illustrates a cross-sectional view of a semiconductor device at a stage of fabrication, in accordance with some embodiments.
FIG. 4 illustrates a cross-sectional view of a semiconductor device at a stage of fabrication, in accordance with some embodiments.

FIG. 3 illustrates a trench 302 in the first epitaxial layer 202, according to some embodiments. In some embodiments, the trench 302 extends through at least a portion of the first epitaxial layer 202. In some embodiments, a portion of the first epitaxial layer 202 is removed to form the trench 302. Embodiments are contemplated in which the trench 302 extends through at least a portion of a layer underlying the first epitaxial layer 202, such as at least one of the substrate 102 or other suitable layer. According to some embodiments, the trench 302 is formed using a first photoresist (not shown). The first photoresist is formed over the first epitaxial layer 202 by at least one of PVD, sputtering, CVD, PECVD, LPCVD, ALCVD, UHVCVD, RPCVD, ALD, MBE, LPE, spin on, growth, or other suitable techniques. The first photoresist comprises a light-sensitive material, where properties, such as solubility, of the first photoresist are affected by light. The first photoresist is a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative image of a pattern defined by opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist.

In some embodiments, a first etching process is performed to remove a portion of the first epitaxial layer 202 to form the trench 302, where one or more openings in the first photoresist allows one or more etchants applied during the first etching process to remove the portion of the first epitaxial layer 202 to form the trench 302 while the first photoresist protects or shields portions of the first epitaxial layer 202 that are covered by the first photoresist. The first etching process is at least one of a dry etching process, a wet etching process, an anisotropic etching process, an isotropic etching process, or other suitable etching process. The first etching process uses at least one of plasma, fluorine, hydrogen fluoride (HF), diluted HF, sulfur hexafluoride ($SF_6$), a chlorine compound such as hydrogen chloride ($HCl_2$), hydrogen sulfide ($H_2S$), tetrafluoromethane ($CF_4$), or other suitable material. The first photoresist is stripped or washed away after the trench 302 is formed. Other processes and/or techniques for forming the trench 302 are within the scope of the present disclosure.

In some embodiments, the first epitaxial layer 202 comprises at least one of a first sidewall 304, a second sidewall 306, or a third sidewall 308 defining the trench 302. In some embodiments, at least one of the first sidewall 304 or the second sidewall 306 is tapered. In some embodiments, the first sidewall 304 has a first slope, such as a negative slope, and the second sidewall 306 has a second slope, such as a positive slope. In some embodiments, the second slope is opposite in polarity relative to the first slope. In some embodiments, a cross-sectional area of the trench 302 decreases along a direction 310, such that a width of an upper portion of the trench 302 is greater than a width of a lower portion of the trench 302. Other structures and/or configurations of the trench 302 relative to other elements, features, etc. are within the scope of the present disclosure.

In some embodiments, the first epitaxial layer 202 having a specific crystallographic orientation, such as crystalline silicon with at least one of a <100> crystallographic orientation, a <110> crystallographic orientation, or a <111> crystallographic orientation, enables the first etching process to form the sidewalls 304, 306, 308. In some embodiments, portions of the first epitaxial layer 202 have different crystallographic orientations, such as at least one of a <100> crystallographic orientation, a <110> crystallographic orientation, or a <111> crystallographic orientation, where etch rates of the first etching process differ between the different crystallographic orientations at least due to different densities of the different crystallographic orientations, resulting in the sidewalls 304, 306 being formed by the first etching process.

FIG. 4 illustrates a first trench isolation structure 402 formed in the trench 302, according to some embodiments. In some embodiments, a material is deposited into the trench 302 to form the first trench isolation structure 402. The first trench isolation structure 402 is formed by at least one of PVD, sputtering, CVD, PECVD, LPCVD, ALCVD, UHVCVD, RPCVD, ALD, MBE, LPE, spin on, growth, or other suitable techniques. The first trench isolation structure 402 comprises at least one of an oxide semiconductor material, such as silicon oxide, or other suitable material. In some embodiments, the first trench isolation structure 402 is a high density plasma (HDP) structure formed by HDP CVD. Other processes and/or techniques for forming the first trench isolation structure 402 are within the scope of the present disclosure. In some embodiments, the first trench isolation structure 402 is a shallow trench isolation structure.

In some embodiments, the first trench isolation structure 402 comprises at least one of (i) a first sidewall 412, such as a top sidewall of the first trench isolation structure 402, (ii) a second sidewall 414, such as a bottom sidewall, underlying the first sidewall 412, (iii) a third sidewall 416 extending from the first sidewall 412 to the second sidewall 414, or (iv) a fourth sidewall 418, opposite the third sidewall 416, extending from the first sidewall 412 to the second sidewall 414. In some embodiments, the second sidewall 414 is in the first epitaxial layer 202. Embodiments are contemplated in which the second sidewall 414 is in a layer different than the first epitaxial layer 202, such as at least one of the substrate 102 or other layer of the semiconductor device 100. In some embodiments, the first sidewall 412 is coplanar with an uppermost surface 404 of the first epitaxial layer 202.

In some embodiments, at least one of the third sidewall 416 of the first trench isolation structure 402 or the fourth sidewall 418 of the first trench isolation structure 402 is tapered. In some embodiments, the third sidewall 416 of the first trench isolation structure 402 has a third slope, such as a negative slope, and the fourth sidewall 418 has a fourth slope, such as a positive slope. In some embodiments, the fourth slope is opposite in polarity relative to the third slope. In some embodiments, at least one of the first slope is about equal to the third slope, or the second slope is about equal to the fourth slope. In some embodiments, a cross-sectional area of the first trench isolation structure 402 decreases along the direction 310 (shown in FIG. 3). In some embodiments, a first width 408 is greater than a second width 410 of a lower portion of the first trench isolation structure 402. In some embodiments, the first width 408 corresponds to a distance between an uppermost portion of the third sidewall 416 and an uppermost portion of the fourth sidewall 418. In some embodiments, the second width 410 corresponds to a distance between a lowermost portion of the third sidewall 416 and a lowermost portion of the fourth sidewall 418. Other structures and/or configurations of the first trench isolation structure 402 relative to other elements, features, etc. are within the scope of the present disclosure.

In some embodiments, a first depth 406 of the second sidewall 414 of the first trench isolation structure 402 is controlled by at least one of an etching pressure of the first etching process performed to form the trench 302 (shown in FIG. 3), an etching temperature of the first etching process, an etching material utilized by the first etching process, an etching time of the first etching process, or other suitable parameter of the first etching process. In some embodiments, the first depth 406 corresponds to a distance between the second sidewall 414 of the first trench isolation structure 402 and the uppermost surface 404 of the first epitaxial layer 202. In some embodiments, the first depth 406 is between about 500 angstroms to about 10,000 angstroms, such as between about 1,500 angstroms to about 4,000 angstroms. In some embodiments, the etching time of the first etching process is increased to increase a depth of the third sidewall 308 defining the trench 302, thereby increasing the first depth 406 (shown in FIG. 4) of the second sidewall 414 of the first trench isolation structure 402. In some embodiments, the etching time of the first etching process is reduced to decrease the depth of the third sidewall 308 defining the trench 302, thereby decreasing the first depth 406 of the second sidewall 414 of the first trench isolation structure 402.

Figures 5, 6:
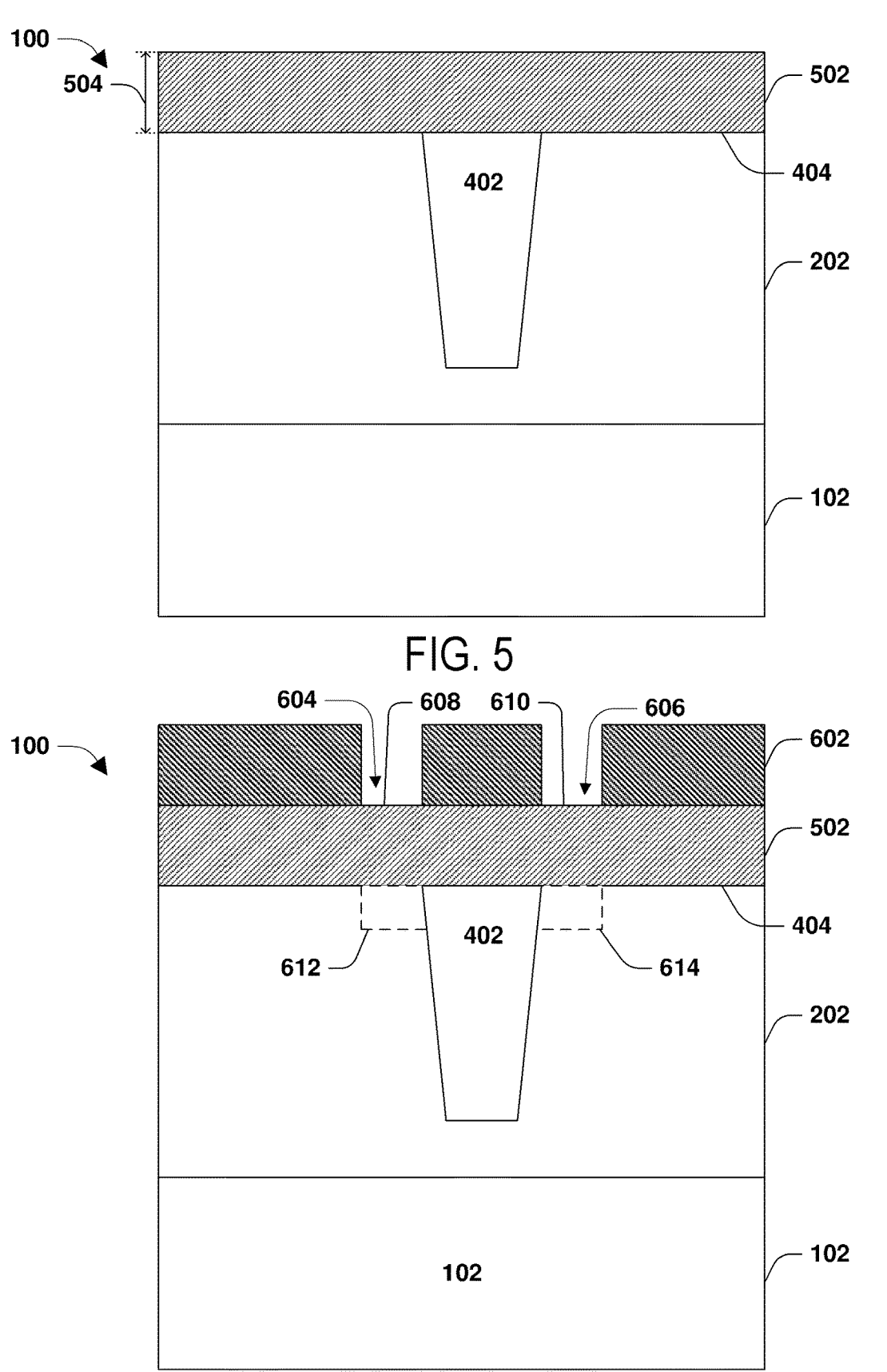
FIG. 5 illustrates a cross-sectional view of a semiconductor device at a stage of fabrication, in accordance with some embodiments.
FIG. 6 illustrates a cross-sectional view of a semiconductor device at a stage of fabrication, in accordance with some embodiments.

FIG. 5 illustrates a first sacrificial layer 502 formed over at least one of the first epitaxial layer 202 or the first trench isolation structure 402, according to some embodiments. The first sacrificial layer 502 at least one of overlies the first epitaxial layer 202, is in direct contact with the uppermost surface 404 of the first epitaxial layer 202, or is in indirect contact with the uppermost surface 404 of the first epitaxial layer 202. The first sacrificial layer 502 at least one of overlies the first trench isolation structure 402, is in direct contact with the first sidewall 412 (shown in FIG. 4) of the first trench isolation structure 402, or is in indirect contact with the first sidewall 412 of the first trench isolation structure 402. The first sacrificial layer 502 is formed by at least one of PVD, sputtering, CVD, PECVD, LPCVD, ALCVD, UHVCVD, RPCVD, ALD, MBE, LPE, spin on, growth, or other suitable techniques. The first sacrificial layer 502 comprises at least one of oxide or other suitable material. In some embodiments, the first sacrificial layer 502 is a sacrificial oxide layer.

FIG. 6 illustrates a first patterned photoresist 602 formed over the first sacrificial layer 502, according to some embodiments. In some embodiments, a second photoresist (not shown) is formed over the first sacrificial layer 502, and the second photoresist is patterned to form the first patterned photoresist 602. In some embodiments, the first patterned photoresist 602 defines at least one of (i) a first opening 604 exposing a first portion 608 of an uppermost surface of the first sacrificial layer 502, or (ii) a second opening 606 exposing a second portion 610 of the uppermost surface of the first sacrificial layer 502. Even though two openings in the first patterned photoresist 602 is depicted, any number of openings in the first patterned photoresist 602 are contemplated.

Figure 7:
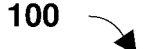
FIG. 7 illustrates a cross-sectional view of a semiconductor device at a stage of fabrication, in accordance with some embodiments.
Figure 7:
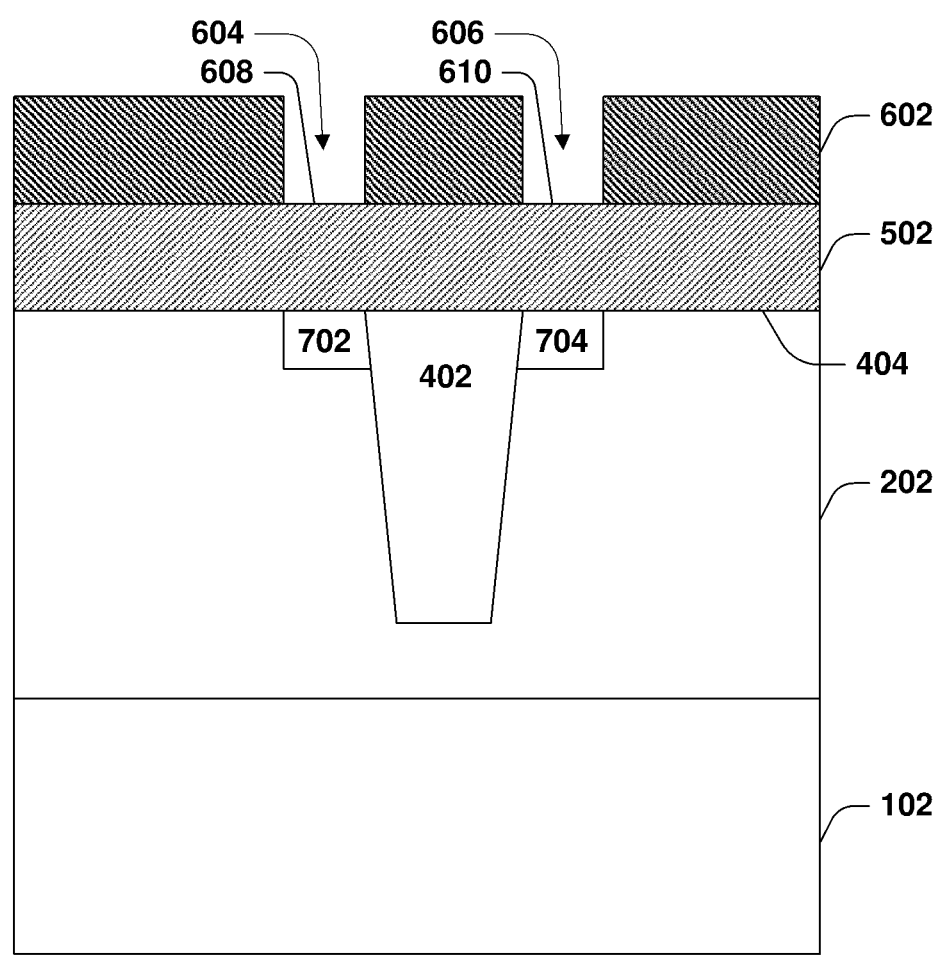

FIG. 7 illustrates use of at least one of the first patterned photoresist 602 or the first sacrificial layer 502 to form at least one of (i) a first doped region 702 having the first conductivity type in the first epitaxial layer 202, or (ii) a second doped region 704 having the first conductivity type in the first epitaxial layer 202, according to some embodiments. In some embodiments, at least one of the first patterned photoresist 602 or the first sacrificial layer 502 is used to dope a first region 612 (shown with a dashed-line rectangle in FIG. 6), comprising a portion of the first epitaxial layer 202, to form the first doped region 702 shown in FIG. 7. In some embodiments, at least one of the first patterned photoresist 602 or the first sacrificial layer 502 is used to dope a second region 614 (shown with a dashed-line rectangle in FIG. 6), comprising a portion of the first epitaxial layer 202, to form the second doped region 704 shown in FIG. 7. In some embodiments, at least one of the first doped region 702 or the second doped region 704 is formed by a first doping process comprising at least one of ion implantation, molecular diffusion, or other suitable techniques. In some embodiments, the first doping process comprises directing dopants having the first conductivity type through one or more portions of the uppermost surface of the first sacrificial layer 502 that are laterally offset from the first patterned photoresist 602. In some embodiments, the dopants comprise p-type dopants comprising at least one of boron dopants, aluminum dopants, gallium dopants, beryllium dopants, or other p-type dopants. In some embodiments, the first patterned photoresist 602 blocks dopants from entering a portion of the u surface of the first sacrificial layer 502 that is covered by the first patterned photoresist 602.

In some embodiments, the first doping process comprises forming the first doped region 702 by directing third dopants having the first conductivity type through at least one of (i) the first portion 608 of the uppermost surface of the first sacrificial layer 502 exposed by the first opening 604, or (ii) a portion, of the uppermost surface 404 of the first epitaxial layer 202, underlying the first portion 608 of the uppermost surface of the first sacrificial layer 502 exposed by the first opening 604. In some embodiments, a depth with which the third dopants penetrate into the semiconductor device 100 in the first doping process is controlled by at least one of (i) controlling a thickness 504 (shown in FIG. 5) of the first sacrificial layer 502, or (ii) controlling a voltage used to direct the third dopants into the semiconductor device 100. In some embodiments, the first doped region 702 has a gradient such that a concentration of dopants changes, such as increases or decreases along the direction 310 (shown in FIG. 3). In some embodiments, the first doped region 702 underlies the first opening 604 in the first patterned photoresist 602.

In some embodiments, the first doping process comprises forming the second doped region 704 by directing fourth dopants having the first conductivity type through at least one of (i) the second portion 610 of the uppermost surface of the first sacrificial layer 502 exposed by the second opening 606, or (ii) a portion, of the uppermost surface 404 of the first epitaxial layer 202, underlying the second portion 610 of the uppermost surface of the first sacrificial layer 502 exposed by the second opening 606. In some embodiments, a depth with which the fourth dopants penetrate into the semiconductor device 100 in the first doping process is controlled by at least one of (i) controlling the thickness 504 of the first sacrificial layer 502, or (ii) controlling a voltage used to direct the fourth dopants into the semiconductor device 100. In some embodiments, the second doped region 704 has a gradient such that a concentration of dopants changes, such as increases or decreases along the direction 310 (shown in FIG. 3). In some embodiments, the second doped region 704 underlies the second opening 606 in the first patterned photoresist 602.

Other processes and techniques for doping at least one of the first region 612 or the second region 614 and/or forming at least one of the first doped region 702 or the second doped region 704 are within the scope of the present disclosure. In some embodiments, the first doped region 702 and the second doped region 704 are doped at least one of concurrently or in the same process, such as the first doping process. Embodiments are contemplated in which the first doped region 702 and the second doped region 704 are doped in separate processes and/or acts. Embodiments are contemplated in which at least one of the first doped region 702 or the second doped region 704 is formed without use of a sacrificial layer, such as without the first sacrificial layer 502.

FIG. 8 illustrates removal of at least one of the first patterned photoresist 602 or the first sacrificial layer 502, according to some embodiments. In some embodiments, at least one of the first patterned photoresist 602 or the first sacrificial layer 502 is removed after at least one of the first doped region 702 or the second doped region 704 is formed. At least one of the first patterned photoresist 602 or the first sacrificial layer 502 is removed by at least one of etching, a washing process, stripping, chemical mechanical planarization (CMP), or other suitable techniques.

Embodiments are contemplated in which a mask layer, such as a hard mask layer, is used to form at least one of the first doped region 702 or the second doped region 704. In some embodiments, a first mask layer (not shown) is formed over the first epitaxial layer 202. The first mask layer is formed by at least one of PVD, sputtering, CVD, PECVD, LPCVD, ALCVD, UHVCVD, RPCVD, ALD, MBE, LPE, spin on, growth, or other suitable techniques. In some embodiments, the first mask layer is a hard mask layer. The first mask layer comprises at least one of oxide, nitride, a metal, or other suitable material. The first mask layer is patterned to form a first patterned mask layer (not shown). In some embodiments, the first mask layer is patterned via an etching process. The etching process uses at least one of plasma, fluorine, HF, diluted HF, $SF_6$, a chlorine compound such as $HCl_2$, $H_2S$, $CF_4$, or other suitable material to remove one or more portions of the first mask layer to form the first patterned mask layer. In some embodiments, the first patterned mask layer includes at least some of the features, relationships with other elements, etc. provided herein with respect to the first patterned photoresist 602. In some embodiments, the first patterned mask layer is used to form at least one of the first doped region 702 or the second doped region 704 using one or more of the techniques provided herein with respect to using the first patterned photoresist 602 to form at least one of the first doped region 702 or the second doped region 704. In some embodiments, the first doping process is performed using the first patterned mask layer. In some embodiments, the first patterned mask layer is removed after the first doping process. In some embodiments, the first patterned mask layer is removed by at least one of CMP, a washing process, etching, or other suitable techniques.

In some embodiments, the first doped region 702 comprises at least one of (i) a first sidewall 802 (shown in FIG. 8), such as a top sidewall of the first doped region 702, (ii) a second sidewall 804, such as a bottom sidewall, underlying the first sidewall 802, (iii) a third sidewall 806 extending from the first sidewall 802 to the second sidewall 804, or (iv) a fourth sidewall 808, opposite the third sidewall 806, extending from the first sidewall 802 to the second sidewall 804. In some embodiments, the first sidewall 802 is coplanar with the first sidewall 412 (shown in FIG. 4) of the first trench isolation structure 402. In some embodiments, the first sidewall 802 comprises a portion of the uppermost surface 404 of the first epitaxial layer 202. In some embodiments, the fourth sidewall 808 comprises a first portion of the first sidewall 304 (shown in FIG. 3) of the first epitaxial layer 202. In some embodiments, the first portion of the first sidewall 304 comprises an uppermost portion of the first sidewall 304 of the first epitaxial layer 202. In some embodiments, the fourth sidewall 808 is at least one of adjacent or aligned with a first portion of the third sidewall 416 of the first trench isolation structure 402. In some embodiments, the first portion of the third sidewall 416 of the first trench isolation structure 402 comprises the uppermost portion of the third sidewall 416 of the first trench isolation structure 402.

In some embodiments, the fourth sidewall 808 of the first doped region 702 is tapered. In some embodiments, a third width 824 of an upper portion of the first doped region 702 is smaller than a fourth width 826 of a lower portion of the first doped region 702. In some embodiments, the third width 824 corresponds to a distance between an uppermost portion of the third sidewall 806 and an uppermost portion of the fourth sidewall 808. In some embodiments, the fourth width 826 corresponds to a distance between a lowermost portion of the third sidewall 806 and a lowermost portion of the fourth sidewall 808. In some embodiments, the third width 824 corresponds to a length of the first sidewall 802 of the first doped region 702. In some embodiments, the fourth width 826 corresponds to a length of the second sidewall 804 of the first doped region 702. Other structures and/or configurations of the first doped region 702 relative to other elements, features, etc. are within the scope of the present disclosure.

In some embodiments, a second depth 810 of the second sidewall 804 of the first doped region 702 is controlled by one or more parameters of the first doping process, such as at least one of (i) a voltage used to direct the third dopants into the semiconductor device 100 to form the first doped region 702, (ii) an implantation energy level used to direct the third dopants into the semiconductor device 100 to form the first doped region 702, (iii) the thickness 504 of the first sacrificial layer 502 through which the third dopants are implanted to form the first doped region 702, or (iv) one or more other suitable parameters. In some embodiments, the second depth 810 corresponds to a distance between the second sidewall 804 of the first doped region 702 and the uppermost surface 404 of the first epitaxial layer 202. In some embodiments, the second depth 810 corresponds to a length of the third sidewall 806 of the first doped region 702. In some embodiments, the second depth 810 is between about 5 angstroms to about 2,000 angstroms, such as between about 15 angstroms to about 800 angstroms. In some embodiments, the second depth 810 is between about a hundredth to about a fifth of the first depth 406 of the second sidewall 414 of the first trench isolation structure 402. In some embodiments, the second depth 810 is between about a hundredth to about a tenth of the first depth 406 of the second sidewall 414 of the first trench isolation structure 402. In some embodiments, the second depth 810 of the second sidewall 804 is between about a hundredth to about a twentieth of the first depth 406 of the second sidewall 414 of the first trench isolation structure 402.

In some embodiments, the second doped region 704 comprises at least one of (i) a first sidewall 812, such as a top sidewall of the second doped region 704, (ii) a second sidewall 814, such as a bottom sidewall, underlying the first sidewall 812, (iii) a third sidewall 816 extending from the first sidewall 812 to the second sidewall 814, or (iv) a fourth sidewall 818, opposite the third sidewall 816, extending from the first sidewall 812 to the second sidewall 814. In some embodiments, the first sidewall 812 of the second doped region 704 is coplanar with at least one of the first sidewall 412 (shown in FIG. 4) of the first trench isolation structure 402 or the first sidewall 802 of the first doped region 702. In some embodiments, the first sidewall 812 of the second doped region 704 comprises a portion of the uppermost surface 404 of the first epitaxial layer 202. In some embodiments, the fourth sidewall 818 of the second doped region 704 comprises a first portion of the second sidewall 306 (shown in FIG. 3) of the first epitaxial layer 202. In some embodiments, the first portion of the second sidewall 306 comprises an uppermost portion of the second sidewall 306 of the first epitaxial layer 202. In some embodiments, the fourth sidewall 818 of the second doped region 704 is at least one of adjacent or aligned with a first portion of the fourth sidewall 418 of the first trench isolation structure 402. In some embodiments, the first portion of the fourth sidewall 418 of the first trench isolation structure 402 comprises the uppermost portion of the fourth sidewall 418 of the first trench isolation structure 402.

In some embodiments, the fourth sidewall 818 of the second doped region 704 is tapered. In some embodiments, a fifth width 828 of an upper portion of the second doped region 704 is smaller than a sixth width 830 of a lower portion of the second doped region 704. In some embodiments, the fifth width 828 corresponds to a distance between an uppermost portion of the third sidewall 816 and an uppermost portion of the fourth sidewall 818. In some embodiments, the sixth width 830 corresponds to a distance between a lowermost portion of the third sidewall 816 and a lowermost portion of the fourth sidewall 818. In some embodiments, the fifth width 828 corresponds to a length of the first sidewall 812 of the second doped region 704. In some embodiments, the sixth width 830 corresponds to a length of the second sidewall 814 of the second doped region 704. Other structures and/or configurations of the second doped region 704 relative to other elements, features, etc. are within the scope of the present disclosure.

In some embodiments, a third depth 820 of the second sidewall 814 of the second doped region 704 is controlled by one or more parameters of the first doping process, such as at least one of (i) a voltage used to direct the fourth dopants into the semiconductor device 100 to form the second doped region 704, (ii) an implantation energy level used to direct the fourth dopants into the semiconductor device 100 to form the second doped region 704, (iii) the thickness 504 of the first sacrificial layer 502 through which the fourth dopants are implanted to form the second doped region 704, or (iv) one or more other suitable parameters. In some embodiments, the third depth 820 corresponds to a distance between the second sidewall 814 of the second doped region 704 and the uppermost surface 404 of the first epitaxial layer 202. In some embodiments, the third depth 820 corresponds to a length of the third sidewall 816 of the second doped region 704. In some embodiments, the third depth 820 is between about 5 angstroms to about 2,000 angstroms, such as between about 15 angstroms to about 800 angstroms. In some embodiments, the third depth 820 is between about a hundredth to about a fifth of the first depth 406 of the second sidewall 414 of the first trench isolation structure 402. In some embodiments, the third depth 820 of the second sidewall 814 is between about a hundredth to about a tenth of the first depth 406 of the second sidewall 414 of the first trench isolation structure 402. In some embodiments, the third depth 820 of the second sidewall 814 is between about a hundredth to about a twentieth of the first depth 406 of the second sidewall 414 of the first trench isolation structure 402.

In some embodiments, the second depth 810 of the second sidewall 804 of the first doped region 702 is about the same as the third depth 820 of the second sidewall 814 of the second doped region 704. Embodiments are contemplated in which the second depth 810 is different than the third depth 820.

FIG. 9 illustrates forming at least one of (i) a third doped region 902 having a second conductivity type in the first epitaxial layer 202, or (ii) a fourth doped region 904 having the second conductivity type in the first epitaxial layer 202, according to some embodiments. In some embodiments, the second conductivity type is different than the first conductivity type. In some embodiments, the first conductivity type is p-type and the second conductivity type is n-type. Embodiments are contemplated in which the first conductivity type is n-type and the second conductivity type is p-type. In some embodiments, at least one of a region of the first epitaxial layer 202 is counter-doped to form the third doped region 902 or a region of the first epitaxial layer 202 is counter-doped to form the fourth doped region 904.

In some embodiments, at least one of the third doped region 902 or the fourth doped region 904 is formed using at least one of a second patterned photoresist (not shown), a second sacrificial layer (not shown) such as a sacrificial oxide layer, or a second patterned mask layer (not shown), such as using one or more of the techniques provided herein with respect to forming at least one of the first doped region 702 or the second doped region 704 using at least one of the first patterned photoresist 602, the first sacrificial layer 502, or the first patterned mask layer. In some embodiments, at least one of the third doped region 902 or the fourth doped region 904 is formed without a sacrificial layer. Embodiments are contemplated in which (i) the first sacrificial layer 502 is not removed prior to forming at least one of the third doped region 902 or the fourth doped region 904, and (ii) at least one of the third doped region 902 or the fourth doped region 904 is formed using the first sacrificial layer 502. In some embodiments, at least one of the third doped region 902 or the fourth doped region 904 is formed by a second doping process comprising at least one of ion implantation, molecular diffusion, or other suitable techniques. In some embodiments, the second doping process comprises directing dopants having the second conductivity type through one or more portions of the uppermost surface 404 of the first epitaxial layer 202. In some embodiments, the dopants are n-type dopants comprising at least one of nitrogen dopants, phosphorus dopants, or other n-type dopants. In some embodiments, at least one of the second patterned photoresist or the second patterned mask layer blocks dopants from entering a portion of the uppermost surface 404 of the first epitaxial layer 202 that is covered by at least one of the second patterned photoresist or the second patterned mask layer.

In some embodiments, the second doping process comprises forming the third doped region 902 by directing fifth dopants having the second conductivity type through a portion of the uppermost surface 404 of the first epitaxial layer 202. In some embodiments, a depth with which the fifth dopants penetrate into the semiconductor device 100 in the second doping process is controlled by at least one of (i) controlling a thickness of the second sacrificial layer (not shown), or (ii) controlling a voltage used to direct the fifth dopants into the semiconductor device 100. In some embodiments, the third doped region 902 has a gradient such that a concentration of dopants changes, such as increases or decreases along the direction 310 (shown in FIG. 3). In some embodiments, the third doped region 902 underlies the first doped region 702.

In some embodiments, the second doping process comprises forming the fourth doped region 904 by directing sixth dopants having the second conductivity type through a portion of the uppermost surface 404 of the first epitaxial layer 202. In some embodiments, a depth with which the sixth dopants penetrate into the semiconductor device 100 in the second doping process is controlled by at least one of (i) controlling the thickness of the second sacrificial layer (not shown), or (ii) controlling a voltage used to direct the sixth dopants into the semiconductor device 100. In some embodiments, the fourth doped region 904 has a gradient such that a concentration of dopants changes, such as increases or decreases along the direction 310 (shown in FIG. 3). In some embodiments, the fourth doped region 904 underlies the second doped region 704.

Other processes and techniques for forming at least one of the third doped region 902 or the fourth doped region 904 are within the scope of the present disclosure. In some embodiments, the third doped region 902 and the fourth doped region 904 are doped at least one of concurrently or in the same process, such as the second doping process. Embodiments are contemplated in which the third doped region 902 and the fourth doped region 904 are doped in separate processes and/or acts.

In some embodiments, the third doped region 902 comprises at least one of (i) a first sidewall 922 (shown in FIG. 9), such as a top sidewall of the third doped region 902, (ii)

a second sidewall 924, such as a bottom sidewall, underlying the first sidewall 922, (iii) a third sidewall 926 extending from the first sidewall 922 to a fourth sidewall 928 of the third doped region 902, or (iv) the fourth sidewall 928 extending from the third sidewall 926 to the second sidewall 924. In some embodiments, the third sidewall 926 of the third doped region 902 is at least one of adjacent or aligned with a second portion of the third sidewall 416 (shown in FIG. 4) of the first trench isolation structure 402. In some embodiments, the second portion of the third sidewall 416 of the first trench isolation structure 402 is under the first portion of the third sidewall 416 of the first trench isolation structure 402. In some embodiments, the fourth sidewall 928 of the third doped region 902 is adjacent a portion 914 of the first epitaxial layer 202. In some embodiments, the second sidewall 924 of the third doped region 902 comprises at least one of a portion of a lowermost surface of the first epitaxial layer 202 or a portion of the uppermost surface of the substrate 102. Embodiments are contemplated in which the second sidewall 924 of the third doped region 902 is over or under at least one of the lowermost surface of the first epitaxial layer 202 or the uppermost surface of the substrate 102. In some embodiments, the third sidewall 926 of the third doped region 902 is tapered. Other structures and/or configurations of the third doped region 902 relative to other elements, features, etc. are within the scope of the present disclosure.

In some embodiments, at least one of a fourth depth 908 of the first sidewall 922 of the third doped region 902 or a fifth depth 906 of the second sidewall 924 of the third doped region 902 is controlled by one or more parameters of the second doping process, such as at least one of (i) a voltage used to direct the fifth dopants into the semiconductor device 100 to form the third doped region 902, (ii) an implantation energy level used to direct the fifth dopants into the semiconductor device 100 to form the third doped region 902, (iii) the thickness of the second sacrificial layer (not shown) through which the fifth dopants are implanted to form the third doped region 902, or (iv) one or more other suitable parameters. In some embodiments, the fourth depth 908 corresponds to a distance between the first sidewall 922 of the third doped region 902 and the uppermost surface 404 of the first epitaxial layer 202. In some embodiments, the fifth depth 906 corresponds to a distance between the second sidewall 924 of the third doped region 902 and the uppermost surface 404 of the first epitaxial layer 202. In some embodiments, the fifth depth 906 is between about 200 angstroms to about 50,000 angstroms, such as between about 1,000 angstroms to about 30,000 angstroms. In some embodiments, at least one of the second depth 810 (shown in FIG. 8) of the second sidewall 804 of the first doped region 702 or the third depth 820 of the second sidewall 814 of the second doped region 704 is between about a thousandth of the fifth depth 906 to about equal to the fifth depth 906 of the second sidewall 924 of the third doped region 902. In some embodiments, at least one of the second depth 810 or the third depth 820 is between about a thousandth to about half of the fifth depth 906 of the second sidewall 924 of the third doped region 902.

In some embodiments, the fourth doped region 904 comprises at least one of (i) a first sidewall 932 (shown in FIG. 9), such as a top sidewall of the fourth doped region 904, (ii) a second sidewall 934, such as a bottom sidewall, underlying the first sidewall 932, (iii) a third sidewall 936 extending from the first sidewall 932 to a fourth sidewall 938 of the fourth doped region 904, or (iv) the fourth sidewall 938 extending from the third sidewall 936 to the second sidewall 934. In some embodiments, the third sidewall 936 of the fourth doped region 904 is at least one of adjacent or aligned with a second portion of the fourth sidewall 418 (shown in FIG. 4) of the first trench isolation structure 402. In some embodiments, the second portion of the fourth sidewall 418 of the first trench isolation structure 402 is under the first portion of the fourth sidewall 418 of the first trench isolation structure 402. In some embodiments, the fourth sidewall 938 of the fourth doped region 904 is adjacent the portion 914 of the first epitaxial layer 202. In some embodiments, the portion 914 of the first epitaxial layer 202 underlies the first trench isolation structure 402. In some embodiments, the portion 914 of the first epitaxial layer 202 is between the third doped region 902 and the fourth doped region 904. In some embodiments, a dopant concentration of dopants having the second conductivity type in the portion 914 of the first epitaxial layer 202 is different than, such as less than, at least one of (i) a dopant concentration of dopants having the second conductivity type in the third doped region 902, or (ii) a dopant concentration of dopants having the second conductivity type in the fourth doped region 904. In some embodiments, the second sidewall 934 of the fourth doped region 904 comprises at least one of a portion of a lowermost surface of the first epitaxial layer 202 or a portion of the uppermost surface of the substrate 102. Embodiments are contemplated in which the second sidewall 934 of the fourth doped region 904 is over or under at least one of the lowermost surface of the first epitaxial layer 202 or the uppermost surface of the substrate 102. In some embodiments, the third sidewall 936 of the fourth doped region 904 is tapered. Other structures and/or configurations of the fourth doped region 904 relative to other elements, features, etc. are within the scope of the present disclosure.

In some embodiments, at least one of a sixth depth 910 of the first sidewall 932 of the fourth doped region 904 or a seventh depth 912 of the second sidewall 934 of the fourth doped region 904 is controlled by one or more parameters of the second doping process, such as at least one of (i) a voltage used to direct the sixth dopants into the semiconductor device 100 to form the fourth doped region 904, (ii) an implantation energy level used to direct the sixth dopants into the semiconductor device 100 to form the fourth doped region 904, (iii) the thickness of the second sacrificial layer (not shown) through which the sixth dopants are implanted to form the fourth doped region 904, or (iv) one or more other suitable parameters. In some embodiments, the sixth depth 910 corresponds to a distance between the first sidewall 932 of the fourth doped region 904 and the uppermost surface 404 of the first epitaxial layer 202. In some embodiments, the seventh depth 912 corresponds to a distance between the second sidewall 934 of the fourth doped region 904 and the uppermost surface 404 of the first epitaxial layer 202. In some embodiments, the seventh depth 912 is between about 200 angstroms to about 50,000 angstroms, such as between about 1,000 angstroms to about 30,000 angstroms. In some embodiments, at least one of the second depth 810 (shown in FIG. 8) of the second sidewall 804 of the first doped region 702 or the third depth 820 of the second sidewall 814 of the second doped region 704 is between about a thousandth of the seventh depth 912 to about equal to the seventh depth 912 of the second sidewall 934 of the fourth doped region 904. In some embodiments, at least one of the second depth 810 or the third depth 820 is between about a thousandth to about half of the seventh depth 912 of the second sidewall 934 of the fourth doped region 904.

In some embodiments, the fourth depth 908 of the first sidewall 922 of the third doped region 902 is about the same as the sixth depth 910 of the first sidewall 932 of the fourth doped region 904. In some embodiments, the fifth depth 906 of the second sidewall 924 of the third doped region 902 is about the same as the seventh depth 912 of the second sidewall 934 of the fourth doped region 904. Embodiments are contemplated in which the fourth depth 908 is different than the sixth depth 910 and/or the fifth depth 906 is different than the seventh depth 912.

FIGS. 10A and 10B illustrate forming at least one of (i) a fifth doped region 1002 having the first conductivity type in the first epitaxial layer 202, or (ii) a sixth doped region 1004 having the first conductivity type in the first epitaxial layer 202, according to some embodiments. In some embodiments, at least one of the fifth doped region 1002 or the sixth doped region 1004 is formed using one or more of the techniques provided herein with respect to forming at least one of the first doped region 702, the second doped region 704, the third doped region 902, or the sixth doped region 1004. In some embodiments, at least one of the fifth doped region 1002 or the sixth doped region 1004 is formed using at least one of the second patterned photoresist (not shown), the second sacrificial layer (not shown), or the second patterned mask layer (not shown). Embodiments are contemplated in which (i) at least one of the second patterned photoresist, the second sacrificial layer, or the second patterned mask layer is not removed prior to forming at least one of the fifth doped region 1002 or the sixth doped region 1004, and (ii) at least one of the fifth doped region 1002 or the sixth doped region 1004 is formed using at least one of the second patterned photoresist, the second sacrificial layer, or the second patterned mask layer. In some embodiments, at least one of the fifth doped region 1002 or the sixth doped region 1004 is formed using at least one of a third patterned photoresist (not shown) different than the second patterned photoresist, a third sacrificial layer (not shown) different than the second patterned photoresist, or a third patterned mask layer (not shown) different than the second patterned photoresist. In some embodiments, at least one of the fifth doped region 1002 or the sixth doped region 1004 is formed without a sacrificial layer. In some embodiments, at least one of the fifth doped region 1002 or the sixth doped region 1004 is formed by a third doping process comprising at least one of ion implantation, molecular diffusion, or other suitable techniques. In some embodiments, the third doping process comprises directing dopants having the first conductivity type through one or more portions of the uppermost surface 404 of the first epitaxial layer 202. In some embodiments, the dopants are p-type dopants comprising at least one of boron dopants, aluminum dopants, gallium dopants, beryllium dopants, or other p-type dopants.

In some embodiments, the third doping process comprises forming the fifth doped region 1002 by directing seventh dopants having the first conductivity type through a portion of the uppermost surface 404 of the first epitaxial layer 202. In some embodiments, a depth with which the seventh dopants penetrate into the semiconductor device 100 in the third doping process is controlled by at least one of a thickness of at least one of the second sacrificial layer or the third sacrificial layer, or (ii) controlling a voltage used to direct the seventh dopants into the semiconductor device 100. In some embodiments, the fifth doped region 1002 has a gradient such that a concentration of dopants changes, such as increases or decreases along the direction 310 (shown in FIG. 3). In some embodiments, the fifth doped region 1002 overlies the third doped region 902. In some embodiments, the first doped region 702 overlies at least a portion of the fifth doped region 1002.

In some embodiments, the third doping process comprises forming the sixth doped region 1004 by directing eighth dopants having the first conductivity type through a portion of the uppermost surface 404 of the first epitaxial layer 202. In some embodiments, a depth with which the eighth dopants penetrate into the semiconductor device 100 in the third doping process is controlled by at least one of (i) controlling the thickness of at least one of the second sacrificial layer or the third sacrificial layer, or (ii) controlling a voltage used to direct the eighth dopants into the semiconductor device 100. In some embodiments, the sixth doped region 1004 has a gradient such that a concentration of dopants changes, such as increases or decreases along the direction 310 (shown in FIG. 3). In some embodiments, the sixth doped region 1004 overlies the fourth doped region 904. In some embodiments, the second doped region 704 overlies at least a portion of the sixth doped region 1004.

Other processes and techniques for forming at least one of the fifth doped region 1002 or the sixth doped region 1004 are within the scope of the present disclosure. In some embodiments, the fifth doped region 1002 and the sixth doped region 1004 are doped at least one of concurrently or in the same process, such as the third doping process. Embodiments are contemplated in which the fifth doped region 1002 and the sixth doped region 1004 are doped in separate processes and/or acts.

In some embodiments, the fifth doped region 1002 comprises at least one of (i) a first sidewall 1022 (shown in FIG. 10B), such as a top sidewall of the fifth doped region 1002, (ii) a second sidewall 1024, such as a bottom sidewall, underlying the first sidewall 1022, (iii) a third sidewall 1026 extending from the second sidewall 1024 to a fourth sidewall 1028 of the fifth doped region 1002, (iv) the fourth sidewall 1028 extending from the third sidewall 1026 to a fifth sidewall 1029, or (v) the fifth sidewall 1029 extending from the fourth sidewall 1028 to the first sidewall 1022. In some embodiments, the first sidewall 1022 of the fifth doped region 1002 comprises a portion of the uppermost surface 404 of the first epitaxial layer 202. In some embodiments, the second sidewall 1024 of the fifth doped region 1002 is at least one of adjacent or aligned with the first sidewall 922 (shown in FIG. 9) of the third doped region 902. In some embodiments, the third sidewall 1026 of the fifth doped region 1002 is at least one of adjacent or aligned with a third portion of the third sidewall 416 (shown in FIG. 4) of the first trench isolation structure 402. In some embodiments, the third portion of the third sidewall 416 of the first trench isolation structure 402 is at least one of under the first portion of the third sidewall 416 of the first trench isolation structure 402 or over the second portion of the third sidewall 416 of the first trench isolation structure 402. In some embodiments, the fourth sidewall 1028 of the fifth doped region 1002 is at least one of adjacent or aligned with the second sidewall 804 (shown in FIG. 8) of the first doped region 702. In some embodiments, the fifth sidewall 1029 of the fifth doped region 1002 is at least one of adjacent or aligned with the third sidewall 806 (shown in FIG. 8) of the first doped region 702.

In some embodiments, the semiconductor device 100 comprises a first p-n junction between the third doped region 902 and the fifth doped region 1002, such as in a region comprising at least one of the second sidewall 924 of the third doped region 902 (shown in FIG. 9) or the second sidewall 1024 of the fifth doped region 1002 (shown in FIG.

10B. In some embodiments, the first p-n junction is formed due to the third doped region 902 having the second conductivity type and the fifth doped region 1002 having the first conductivity type. Embodiments are contemplated in which the semiconductor device 100 comprises a first intrinsic region (not shown) between the third doped region 902 and the fifth doped region 1002, thereby forming a PIN diode structure in the first p-n junction. In some embodiments, a first photodiode 1012 comprises at least one of the first doped region 702, the third doped region 902, the fifth doped region 1002, the first p-n junction, or the first intrinsic region.

In some embodiments, the sixth doped region 1004 comprises at least one of (i) a first sidewall 1032 (shown in FIG. 10B), such as a top sidewall of the sixth doped region 1004, (ii) a second sidewall 1034, such as a bottom sidewall, underlying the first sidewall 1032, (iii) a third sidewall 1036 extending from the second sidewall 1034 to a fourth sidewall 1038 of the sixth doped region 1004, (iv) the fourth sidewall 1038 extending from the third sidewall 1036 to a fifth sidewall 1039, or (v) the fifth sidewall 1039 extending from the fourth sidewall 1038 to the first sidewall 1032. In some embodiments, the first sidewall 1032 of the sixth doped region 1004 comprises a portion of the uppermost surface 404 of the first epitaxial layer 202. In some embodiments, the second sidewall 1034 of the sixth doped region 1004 is at least one of adjacent or aligned with the first sidewall 932 (shown in FIG. 9) of the fourth doped region 904. In some embodiments, the third sidewall 1036 of the sixth doped region 1004 is at least one of adjacent or aligned with a third portion of the fourth sidewall 418 (shown in FIG. 4) of the first trench isolation structure 402. In some embodiments, the third portion of the fourth sidewall 418 of the first trench isolation structure 402 is at least one of under the first portion of the fourth sidewall 418 of the first trench isolation structure 402 or over the second portion of the fourth sidewall 418 of the first trench isolation structure 402. In some embodiments, the fourth sidewall 1038 of the sixth doped region 1004 is at least one of adjacent or aligned with the second sidewall 814 (shown in FIG. 8) of the second doped region 704. In some embodiments, the fifth sidewall 1039 of the sixth doped region 1004 is at least one of adjacent or aligned with the third sidewall 816 (shown in FIG. 8) of the second doped region 704.

In some embodiments, the semiconductor device 100 comprises a second p-n junction between the fourth doped region 904 and the sixth doped region 1004, such as in a region comprising at least one of the second sidewall 924 of the fourth doped region 904 (shown in FIG. 9) or the second sidewall 1024 of the sixth doped region 1004 (shown in FIG. 10B. In some embodiments, the second p-n junction is formed due to the fourth doped region 904 having the second conductivity type and the sixth doped region 1004 having the first conductivity type. Embodiments are contemplated in which the semiconductor device 100 comprises a second intrinsic region (not shown) between the fourth doped region 904 and the sixth doped region 1004, thereby forming a PIN diode structure in the second p-n junction. In some embodiments, a second photodiode 1014 comprises at least one of the second doped region 704, the fourth doped region 904, the sixth doped region 1004, the second p-n junction, or the second intrinsic region.

In some embodiments, radiation is projected towards the semiconductor device 100, such as at least one of in the direction 310 (shown in FIG. 3) or in a different direction. At least some of the radiation is at least one of sensed, detected, or converted to electrons by the first photodiode 1012. In some embodiments, the semiconductor device 100 comprises one or more first layers (not shown) overlying the first epitaxial layer 202. In some embodiments, the one or more first layers comprise at least one of a dielectric layer, a color filter layer, a lens array, or other suitable layer. In some embodiments, the lens array comprises a lens, such as a micro-lens or other suitable lens, overlying the first photodiode 1012. In some embodiments, at least some of the radiation passes through the one or more first layers and is at least one of sensed, detected, or converted to electrons by the first photodiode 1012.

In some embodiments, radiation is converted to electrons using the first p-n junction. In some embodiments, a pixel of an image is generated based upon a first metric associated with the electrons converted by the first p-n junction. In some embodiments, the first metric is based upon at least one of an intensity, a charge, a current read out, etc. associated with the electrons converted by the first p-n junction. In some embodiments, a first read out circuit (not shown) of the semiconductor device 100 is used to measure the electrons converted using the first p-n junction to determine the first metric.

In some embodiments, the first doped region 702 at least one of prevents or mitigates generation of dark current in the semiconductor device 100, such as current that is generated when there is no incident radiation. In some embodiments, when dark current is generated in a semiconductor device, the dark current impacts, such as introduces noise to, measurements of a read out circuit (such as the first read out circuit), thereby causing inaccuracies in a signal, such as an image, determined using the sensor (implemented by the semiconductor device 100). Thus, by at least one of preventing or mitigating generation of dark current using the first doped region 702, the first photodiode 1012 including the first doped region 702 provides for improved accuracy and/or improved resolution of the sensor as compared to a semiconductor device that does not include the first doped region 702 in the first photodiode 1012.

In some embodiments, the second depth 810 (shown in FIG. 8) of the second sidewall 804 of the first doped region 702 is at most about a first threshold proportion relative to the first depth 406 of the second sidewall 414 of the first trench isolation structure 402. In some embodiments, the first threshold proportion is about 20% (such that the second depth 810 is at most about a fifth of the first depth 406). In some embodiments, the first threshold proportion is about 10% (such that the second depth 810 is at most about a tenth of the first depth 406). In some embodiments, the first threshold proportion is about 5% (such that the second depth 810 is at most about a twentieth of the first depth 406). In some embodiments, the second sidewall 804 of the first doped region 702 having the second depth 810 that is at most about the first threshold proportion relative to the first depth 406 of the second sidewall 414 of the first trench isolation structure 402 provides for improved performance of at least one of the first photodiode 1012 or the semiconductor device 100. In some embodiments, the second sidewall 804 of the first doped region 702 having the second depth 810 that is at most about the first threshold proportion relative to the first depth 406 of the second sidewall 414 of the first trench isolation structure 402 provides for at least one of (i) improved protection against generation of dark current in at least one of the first photodiode 1012 or the semiconductor device 100, or (ii) reduced generation of dark current in at least one of the first photodiode 1012 or the semiconductor device 100, as compared to an implementation in which the second depth 810 is greater than the first threshold proportion of the first depth 406.

In some embodiments, the second depth 810 (shown in FIG. 8) of the second sidewall 804 of the first doped region 702 is at most about a first threshold depth. In some embodiments, the first threshold depth is about 2,000 angstroms (such that the second depth 810 is at most about 2,000 angstroms). In some embodiments, the first threshold depth is about 800 angstroms (such that the second depth 810 is at most about 800 angstroms). In some embodiments, the first threshold depth is about 400 angstroms (such that the second depth 810 is at most about 400 angstroms. In some embodiments, the second sidewall 804 of the first doped region 702 having the second depth 810 that is at most about the first threshold depth provides for improved performance of at least one of the first photodiode 1012 or the semiconductor device 100. In some embodiments, the second sidewall 804 of the first doped region 702 having the second depth 810 that is at most about the first threshold depth provides for at least one of (i) improved protection against generation of dark current in at least one of the first photodiode 1012 or the semiconductor device 100, or (ii) reduced generation of dark current in at least one of the first photodiode 1012 or the semiconductor device 100, as compared to an implementation in which the second depth 810 is greater than the first threshold depth.

In some embodiments, the second depth 810 (shown in FIG. 8) of the second sidewall 804 of the first doped region 702 is at most about a second threshold proportion relative to the fifth depth 906 of the second sidewall 924 of the third doped region 902. In some embodiments, the fifth depth 906 of the second sidewall 924 of the third doped region 902 corresponds to a photodiode depth of the first photodiode 1012. In some embodiments, the second threshold proportion is about 100% (such that the second depth 810 is at most about equal to the fifth depth 906). In some embodiments, the second threshold proportion is about 50% (such that the second depth 810 is at most about half of the fifth depth 906). In some embodiments, the second sidewall 804 of the first doped region 702 having the second depth 810 that is at most about the second threshold proportion relative to the fifth depth 906 of the second sidewall 924 of the third doped region 902 provides for at least one of (i) improved protection against generation of dark current in at least one of the first photodiode 1012 or the semiconductor device 100, or (ii) reduced generation of dark current in at least one of the first photodiode 1012 or the semiconductor device 100, as compared to an implementation in which the second depth 810 is greater than the second threshold proportion of the fifth depth 906.

In some embodiments, the second depth 810 of the second sidewall 804 of the first doped region 702 is reduced in comparison with some semiconductor devices, such as implementations in which the second depth 810 is greater than at least one of the first threshold depth, the first threshold proportion of the first depth 406, or the second threshold proportion of the fifth depth 906. In some embodiments, the second depth 810 is decreased by at least one of (i) decreasing a voltage used to direct the third dopants into the semiconductor device 100 to form the first doped region 702, (ii) decreasing an implantation energy level used to direct the third dopants into the semiconductor device 100 to form the first doped region 702, (iii) decreasing the thickness 504 of the first sacrificial layer 502 through which the third dopants are implanted to form the first doped region 702, or (iv) adjusting one or more other suitable parameters.

In some embodiments, the third depth 820 (shown in FIG. 8) of the second sidewall 814 of the second doped region 704 has one or more of the features, relationships with other dimensions, etc. provided herein with respect to the second depth 810 of the second sidewall 804 of the first doped region 702. In some embodiments, the third depth 820 (shown in FIG. 8) of the second sidewall 814 of the second doped region 704 is at most about the first threshold proportion relative to the first depth 406 of the second sidewall 414 of the first trench isolation structure 402. In some embodiments, the third depth 820 of the second sidewall 814 of the second doped region 704 is at most about the first threshold depth. In some embodiments, the third depth 820 of the second sidewall 814 of the second doped region 704 is at most about the second threshold proportion relative to the seventh depth 912 of the second sidewall 934 of the fourth doped region 904. In some embodiments, the seventh depth 912 of the second sidewall 934 of the fourth doped region 904 corresponds to a second photodiode depth of the second photodiode 1014.

In some embodiments, a distance 822 (shown in FIG. 8) between the third sidewall 806 of the first doped region 702 and the third sidewall 816 of the second doped region 704 is at most about a third threshold proportion relative to the first width 408 (shown in FIG. 4) of the first trench isolation structure 402. In some embodiments, the third threshold proportion is about 700% (such that the distance 822 is at most about equal to seven times the first width 408 of the first trench isolation structure 402). In some embodiments, the third threshold proportion is about 500% (such that the distance 822 is at most about equal to five times the first width 408 of the first trench isolation structure 402). In some embodiments, the distance 822 between the third sidewall 806 of the first doped region 702 and the third sidewall 816 of the second doped region 704 being at most about the third threshold proportion relative to the first width 408 of the first trench isolation structure 402 provides for at least one of (i) improved protection against generation of dark current in at least one of the first photodiode 1012 or the semiconductor device 100, or (ii) reduced generation of dark current in at least one of the first photodiode 1012 or the semiconductor device 100, as compared to an implementation in which the distance 822 is greater than the third threshold proportion of the first width 408 of the first trench isolation structure 402.

In some embodiments, a dopant concentration of dopants having the first conductivity type in the first doped region 702 is about equal to a dopant concentration of dopants having the first conductivity type in the second doped region 704. Embodiments are contemplated in which the dopant concentration of dopants having the first conductivity type in the first doped region 702 is different than the dopant concentration of dopants having the first conductivity type in the second doped region 704.

In some embodiments, a dopant concentration of dopants having the second conductivity type in the third doped region 902 is about equal to a dopant concentration of dopants having the second conductivity type in the fourth doped region 904. Embodiments are contemplated in which the dopant concentration of dopants having the second conductivity type in the third doped region 902 is different than the dopant concentration of dopants having the second conductivity type in the fourth doped region 904.

In some embodiments, a dopant concentration of dopants having the first conductivity type in the fifth doped region 1002 is about equal to a dopant concentration of dopants having the first conductivity type in the sixth doped region 1004. Embodiments are contemplated in which the dopant concentration of dopants having the first conductivity type in the fifth doped region 1002 is different than the dopant concentration of dopants having the first conductivity type in the sixth doped region 1004.

In some embodiments, the dopant concentration of dopants having the first conductivity type in the first doped region 702 is greater than the dopant concentration of dopants having the first conductivity type in the fifth doped region 1002. In some embodiments, the dopant concentration of dopants having the first conductivity type in the second doped region 704 is greater than the dopant concentration of dopants having the first conductivity type in the sixth doped region 1004.

In some embodiments, the first epitaxial layer 202 comprises only a single layer. Embodiments are contemplated in which the first epitaxial layer 202 comprises a plurality of layers.

Embodiments are contemplated in which the semiconductor device 100 does not comprise at least one of the substrate 102 or the first epitaxial layer 202, and the semiconductor device 100 comprises a semiconductor body (in place of at least one of the substrate 102 or the first epitaxial layer 202). In some embodiments, the semiconductor body comprises at least one of a semiconductor layer, a substrate, an epitaxial layer, or other suitable layer. In some embodiments, the semiconductor body comprises one or more layers. In some embodiments, the semiconductor body comprises dopants having the first conductivity type. In some embodiments, the semiconductor body includes at least some of the features, relationships with other elements, etc. provided herein with respect to at least one of the substrate 102 or the first epitaxial layer 202. In some embodiments, the semiconductor body comprises at least one of silicon, germanium, carbide, arsenide, gallium, arsenic, phosphide, indium, antimonide, SiGe, SiC, GaAs, GaN, GaP, InGaP, InP, InAs, InSb, GaAsP, AlInAs, AlGaAs, GaInAs, GaInP, GaInAsP, or other suitable material. In some embodiments, the first photodiode 1012 and the second photodiode 1014 are in the semiconductor body.

Embodiments are contemplated in which at least one of the fifth doped region 1002 or the sixth doped region 1004 is formed prior to at least one of the first doped region 702, the second doped region 704, the third doped region 902, or the fourth doped region 904. Embodiments are contemplated in which at least one of the third doped region 902 or the fourth doped region 904 is formed prior to at least one of the first doped region 702 or the second doped region 704.

Embodiments are contemplated in which at least one of (i) the first depth 406 of the second sidewall 414 of the first trench isolation structure 402 corresponds to a distance between a first surface and the second sidewall 414 of the first trench isolation structure 402, (ii) the second depth 810 of the second sidewall 804 of the first doped region 702 corresponds to a distance between the first surface and the second sidewall 804 of the first doped region 702, (iii) the third depth 820 of the second sidewall 814 of the second doped region 704 corresponds to a distance between the first surface and the second sidewall 814 of the second doped region 704, (iv) the fourth depth 908 of the first sidewall 922 of the third doped region 902 corresponds to a distance between the first surface and the first sidewall 922 of the third doped region 902, (v) the fifth depth 906 of the second sidewall 924 of the third doped region 902 corresponds to a distance between the first surface and the second sidewall 924 of the third doped region 902, (vi) the sixth depth 910 of the first sidewall 932 of the fourth doped region 904 corresponds to a distance between the first surface and the first sidewall 932 of the fourth doped region 904, or (vii) the seventh depth 912 of the second sidewall 934 of the fourth doped region 904 corresponds to a distance between the first surface and the second sidewall 934 of the fourth doped region 904. In some embodiments, the first surface corresponds to an uppermost surface of a first layer of the one or more first layers (not shown) overlying the first epitaxial layer 202. In some embodiments, the first layer of the one or more first layers corresponds to an uppermost layer of the one or more first layers. In some embodiments, the first layer of the one or more first layers comprises the lens array. In some embodiments, the first layer of the one or more first layers comprises an oxide diffusion (OD) layer. In some embodiments, the first surface comprises an OD surface. In some embodiments, the first surface comprises a surface of an OD region of the semiconductor device 100. In some embodiments, the first surface comprises a surface of an active region of the semiconductor device 100. In some embodiments, the first surface corresponds to a surface, such as an uppermost surface, of the semiconductor body comprising the first photodiode 1012 and the second photodiode 1014.

Figure 11:
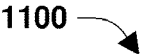
FIG. 11 illustrates a cross-sectional view of a semiconductor device, in accordance with some embodiments.
Figure 11:
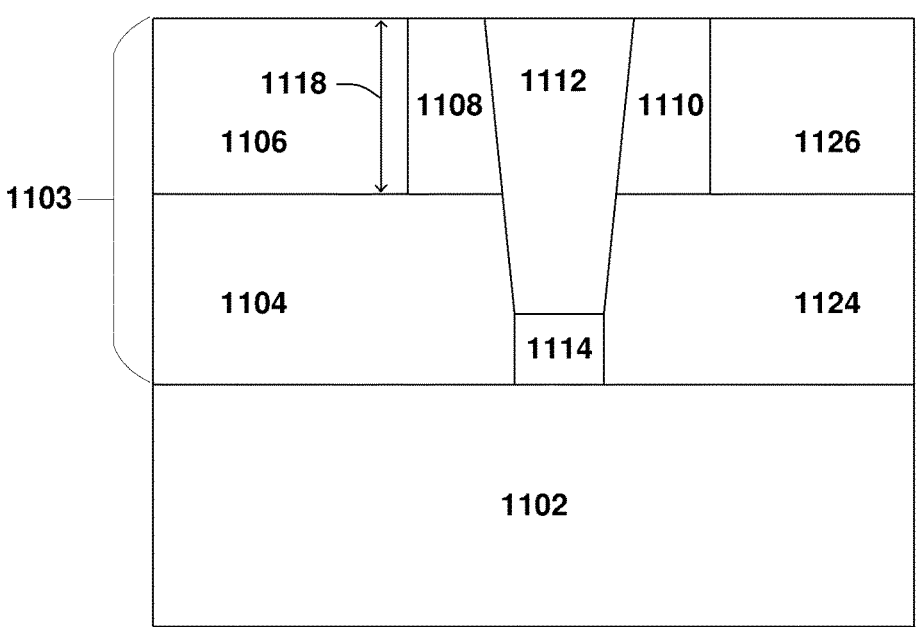

FIG. 11 illustrates a semiconductor device 1100 according to some embodiments. In some embodiments, the semiconductor device 1100 is formed using one or more of the techniques provided herein with respect to forming the semiconductor device 100 (shown in FIGS. 1-10B). In some embodiments, a component of the semiconductor device 1100 includes at least some of the features, relationships with other elements, etc. provided herein with respect to the semiconductor device 100 (shown in FIGS. 1-10B). In some embodiments, a component of the semiconductor device 1100 has and/or satisfies one, some, and/or all of the relationships provided herein with respect to at least one of the first threshold proportion, the first threshold depth, the second threshold proportion, or the third threshold proportion.

In some embodiments, the semiconductor device 1100 comprises at least one of a substrate 1102 (such as the substrate 102 of the semiconductor device 100), a first epitaxial layer 1103 (such as the first epitaxial layer 202 of the semiconductor device 100) over the substrate 1102, a first photodiode, a second photodiode, or a first trench isolation structure 1112 between the first photodiode and the second photodiode. In some embodiments, the first photodiode comprises at least one of a first doped region 1108 (such as the first doped region 702 of the semiconductor device 100) having the first conductivity type, a second doped region 1104 (such as the third doped region 902 of the semiconductor device 100) having the second conductivity type, or a third doped region 1106 (such as the fifth doped region 1002 of the semiconductor device 100) having the first conductivity type. In some embodiments, the second photodiode comprises at least one of a fourth doped region 1110 (such as the second doped region 704 of the semiconductor device 100) having the first conductivity type, a fifth doped region 1124 (such as the fourth doped region 904 of the semiconductor device 100) having the second conductivity type, or a sixth doped region 1126 (such as the sixth doped region 1004 of the semiconductor device 100) having the first conductivity type. In some embodiments, the first trench isolation structure 1112 overlies a portion 1114 of the first epitaxial layer 1103. In some embodiments, the portion 1114 is between the second doped region 1104 and the fifth doped region 1124. In some embodiments, the first conductivity type is p-type and the second conductivity type is n-type. Embodiments are contemplated in which the first conductivity type is n-type and the second conductivity type is p-type.

In some embodiments, the substrate 1102 comprises dopants having the first conductivity type. In some embodiments, a dopant concentration of dopants having the first conductivity type in the portion 1114 of the first epitaxial layer 1103 is less than at least one of (i) a dopant concentration of dopants having the first conductivity type in the first doped region 1108, (ii) a dopant concentration of dopants having the first conductivity type in the third doped region 1106, (iii) a dopant concentration of dopants having the first conductivity type in the fourth doped region 1110, or (iv) a dopant concentration of dopants having the first conductivity type in the sixth doped region 1126. In some embodiments, the dopant concentration of dopants having the first conductivity type in the first doped region 1108 is greater than the dopant concentration of dopants having the first conductivity type in the third doped region 1106. In some embodiments, the dopant concentration of dopants having the first conductivity type in the fourth doped region 1110 is greater than the dopant concentration of dopants having the first conductivity type in the sixth doped region 1126.

In some embodiments, at least one of (i) the first epitaxial layer 1103 is formed using one or more of the techniques provided herein with respect to forming the first epitaxial layer 202 of the semiconductor device 100, (ii) the first trench isolation structure 1112 is formed using one or more of the techniques provided herein with respect to forming the first trench isolation structure 402 of the semiconductor device 100, (iii) the first doped region 1108 is formed using one or more of the techniques provided herein with respect to forming the first doped region 702 of the semiconductor device 100, (iv) the third doped region 1106 is formed using one or more of the techniques provided herein with respect to forming the fifth doped region 1002 of the semiconductor device 100, (v) the fourth doped region 1110 is formed using one or more of the techniques provided herein with respect to forming the second doped region 704 of the semiconductor device 100, (vi) the fifth doped region 1124 is formed using one or more of the techniques provided herein with respect to forming the fourth doped region 904 of the semiconductor device 100, or (vii) the sixth doped region 1126 is formed using one or more of the techniques provided herein with respect to forming the sixth doped region 1004 of the semiconductor device 100.

In some embodiments, a bottom sidewall of the first doped region 1108 is at least one of adjacent or aligned with a sidewall of the second doped region 1104. In some embodiments, a bottom sidewall of the fourth doped region 1110 is at least one of adjacent or aligned with a sidewall of the fifth doped region 1124.

Figure 12:
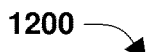
FIG. 12 illustrates a cross-sectional view of a semiconductor device, in accordance with some embodiments.
Figure 12:
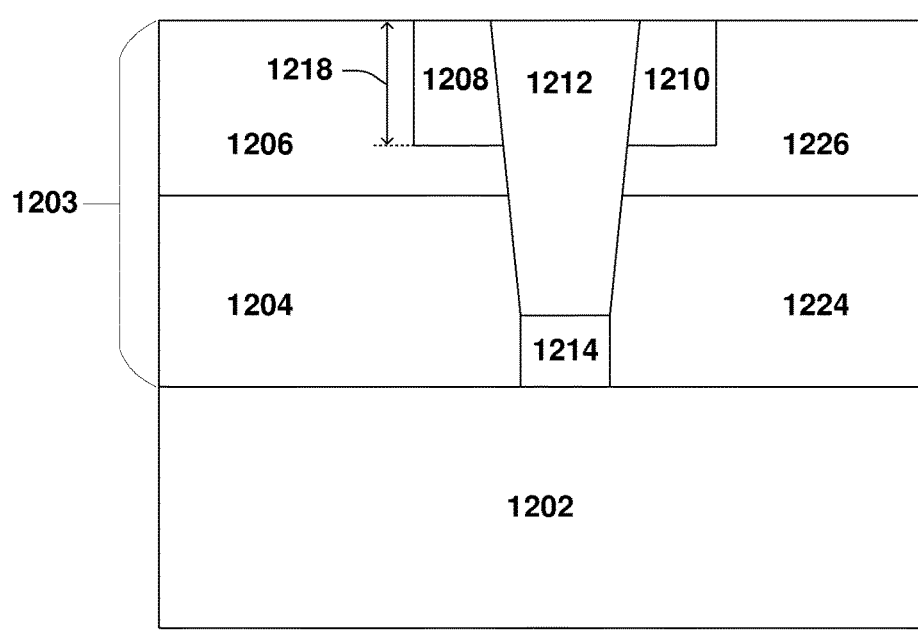

FIG. 12 illustrates a semiconductor device 1200 according to some embodiments. In some embodiments, the semiconductor device 1200 is formed using one or more of the techniques provided herein with respect to forming the semiconductor device 100 (shown in FIGS. 1-10B). In some embodiments, a component of the semiconductor device 1200 includes at least some of the features, relationships with other elements, etc. provided herein with respect to the semiconductor device 100 (shown in FIGS. 1-10B). In some embodiments, a component of the semiconductor device 1200 has and/or satisfies one, some, and/or all of the relationships provided herein with respect to at least one of the first threshold proportion, the first threshold depth, the second threshold proportion, or the third threshold proportion.

In some embodiments, the semiconductor device 1200 comprises at least one of a substrate 1202 (such as the substrate 102 of the semiconductor device 100), a first epitaxial layer 1203 (such as the first epitaxial layer 202 of the semiconductor device 100) over the substrate 1202, a first photodiode, a second photodiode, or a first trench isolation structure 1212 between the first photodiode and the second photodiode. In some embodiments, the first photodiode comprises at least one of a first doped region 1208 (such as the first doped region 702 of the semiconductor device 100) having the first conductivity type, a second doped region 1204 (such as the third doped region 902 of the semiconductor device 100) having the second conductivity type, or a third doped region 1206 (such as the fifth doped region 1002 of the semiconductor device 100) having the first conductivity type. In some embodiments, the second photodiode comprises at least one of a fourth doped region 1210 (such as the second doped region 704 of the semiconductor device 100) having the first conductivity type, a fifth doped region 1224 (such as the fourth doped region 904 of the semiconductor device 100) having the second conductivity type, or a sixth doped region 1226 (such as the sixth doped region 1004 of the semiconductor device 100) having the first conductivity type. In some embodiments, the first trench isolation structure 1212 overlies a portion 1214 of the first epitaxial layer 1203. In some embodiments, the portion 1214 is between the second doped region 1204 and the fifth doped region 1224. In some embodiments, the first conductivity type is p-type and the second conductivity type is n-type. Embodiments are contemplated in which the first conductivity type is n-type and the second conductivity type is p-type.

In some embodiments, the substrate 1202 comprises dopants having the first conductivity type. In some embodiments, a dopant concentration of dopants having the first conductivity type in the portion 1214 of the first epitaxial layer 1203 is less than at least one of (i) a dopant concentration of dopants having the first conductivity type in the first doped region 1208, (ii) a dopant concentration of dopants having the first conductivity type in the third doped region 1206, (iii) a dopant concentration of dopants having the first conductivity type in the fourth doped region 1210, or (iv) a dopant concentration of dopants having the first conductivity type in the sixth doped region 1226. In some embodiments, the dopant concentration of dopants having the first conductivity type in the first doped region 1208 is greater than the dopant concentration of dopants having the first conductivity type in the third doped region 1206. In some embodiments, the dopant concentration of dopants having the first conductivity type in the fourth doped region 1210 is greater than the dopant concentration of dopants having the first conductivity type in the sixth doped region 1226.

In some embodiments, at least one of (i) the first epitaxial layer 1203 is formed using one or more of the techniques provided herein with respect to forming the first epitaxial layer 202 of the semiconductor device 100, (ii) the first trench isolation structure 1212 is formed using one or more of the techniques provided herein with respect to forming the first trench isolation structure 402 of the semiconductor device 100, (iii) the first doped region 1208 is formed using one or more of the techniques provided herein with respect to forming the first doped region 702 of the semiconductor device 100, (iv) the third doped region 1206 is formed using one or more of the techniques provided herein with respect to forming the fifth doped region 1002 of the semiconductor device 100, (v) the fourth doped region 1210 is formed using one or more of the techniques provided herein with respect to forming the second doped region 704 of the semiconductor device 100, (vi) the fifth doped region 1224 is formed using one or more of the techniques provided herein with respect to forming the fourth doped region 904 of the semiconductor device 100, or (vii) the sixth doped region 1226 is formed using one or more of the techniques provided herein with respect to forming the sixth doped region 1004 of the semiconductor device 100.

Figure 13:
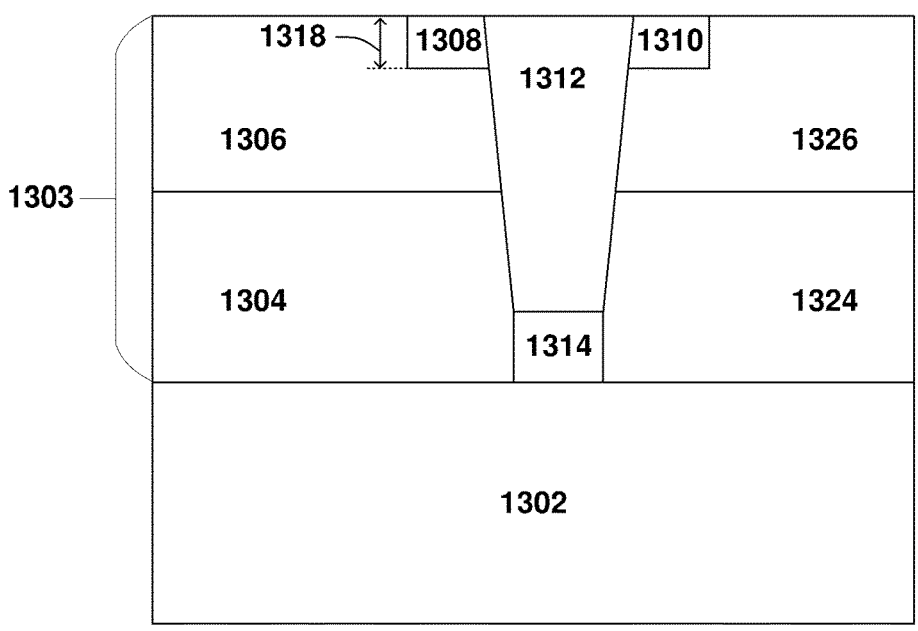
FIG. 13 illustrates a cross-sectional view of a semiconductor device, in accordance with some embodiments.

FIG. 13 illustrates a semiconductor device 1300 according to some embodiments. In some embodiments, the semiconductor device 1300 is formed using one or more of the techniques provided herein with respect to forming the semiconductor device 100 (shown in FIGS. 1-10B). In some embodiments, a component of the semiconductor device 1300 includes at least some of the features, relationships with other elements, etc. provided herein with respect to the semiconductor device 100 (shown in FIGS. 1-10B). In some embodiments, a component of the semiconductor device 1300 has and/or satisfies one, some, and/or all of the relationships provided herein with respect to at least one of the first threshold proportion, the first threshold depth, the second threshold proportion, or the third threshold proportion.

In some embodiments, the semiconductor device 1300 comprises at least one of a substrate 1302 (such as the substrate 102 of the semiconductor device 100), a first epitaxial layer 1303 (such as the first epitaxial layer 202 of the semiconductor device 100) over the substrate 1302, a first photodiode, a second photodiode, or a first trench isolation structure 1312 between the first photodiode and the second photodiode. In some embodiments, the first photodiode comprises at least one of a first doped region 1308 (such as the first doped region 702 of the semiconductor device 100) having the first conductivity type, a second doped region 1304 (such as the third doped region 902 of the semiconductor device 100) having the second conductivity type, or a third doped region 1306 (such as the fifth doped region 1002 of the semiconductor device 100) having the first conductivity type. In some embodiments, the second photodiode comprises at least one of a fourth doped region 1310 (such as the second doped region 704 of the semiconductor device 100) having the first conductivity type, a fifth doped region 1324 (such as the fourth doped region 904 of the semiconductor device 100) having the second conductivity type, or a sixth doped region 1326 (such as the sixth doped region 1004 of the semiconductor device 100) having the first conductivity type. In some embodiments, the first trench isolation structure 1312 overlies a portion 1314 of the first epitaxial layer 1303. In some embodiments, the portion 1314 is between the second doped region 1304 and the fifth doped region 1324. In some embodiments, the first conductivity type is p-type and the second conductivity type is n-type. Embodiments are contemplated in which the first conductivity type is n-type and the second conductivity type is p-type.

In some embodiments, the substrate 1302 comprises dopants having the first conductivity type. In some embodiments, a dopant concentration of dopants having the first conductivity type in the portion 1314 of the first epitaxial layer 1303 is less than at least one of (i) a dopant concentration of dopants having the first conductivity type in the first doped region 1308, (ii) a dopant concentration of dopants having the first conductivity type in the third doped region 1306, (iii) a dopant concentration of dopants having the first conductivity type in the fourth doped region 1310, or (iv) a dopant concentration of dopants having the first conductivity type in the sixth doped region 1326. In some embodiments, the dopant concentration of dopants having the first conductivity type in the first doped region 1308 is greater than the dopant concentration of dopants having the first conductivity type in the third doped region 1306. In some embodiments, the dopant concentration of dopants having the first conductivity type in the fourth doped region 1310 is greater than the dopant concentration of dopants having the first conductivity type in the sixth doped region 1326.

In some embodiments, at least one of (i) the first epitaxial layer 1303 is formed using one or more of the techniques provided herein with respect to forming the first epitaxial layer 202 of the semiconductor device 100, (ii) the first trench isolation structure 1312 is formed using one or more of the techniques provided herein with respect to forming the first trench isolation structure 402 of the semiconductor device 100, (iii) the first doped region 1308 is formed using one or more of the techniques provided herein with respect to forming the first doped region 702 of the semiconductor device 100, (iv) the third doped region 1306 is formed using one or more of the techniques provided herein with respect to forming the fifth doped region 1002 of the semiconductor device 100, (v) the fourth doped region 1310 is formed using one or more of the techniques provided herein with respect to forming the second doped region 704 of the semiconductor device 100, (vi) the fifth doped region 1324 is formed using one or more of the techniques provided herein with respect to forming the fourth doped region 904 of the semiconductor device 100, or (vii) the sixth doped region 1326 is formed using one or more of the techniques provided herein with respect to forming the sixth doped region 1004 of the semiconductor device 100.

In some embodiments, an amount of dark current generated in a sensor implemented using one or more of the techniques provided herein is dependent upon a first doped region depth of the sensor. In some embodiments, the first doped region depth corresponds to at least one of the second depth 810 of the second sidewall 804 of the first doped region 702 of the semiconductor device 100 shown in FIG. 8, a depth 1118 of a bottom sidewall of the first doped region 1108 shown in FIG. 11, a depth 1218 of a bottom sidewall of the first doped region 1208 shown in FIG. 12, or a depth 1318 of a bottom sidewall of the first doped region 1308 shown in FIG. 13. In some embodiments, decreasing the first doped region depth provides for reduced dark current generated in the sensor, thereby providing for improved accuracy and/or resolution of the sensor. In some embodiments, a sensor implemented via the semiconductor device 1200 shown in FIG. 12 has less dark current and/or noise compared to a sensor implemented via the semiconductor device 1100 shown in FIG. 11 based upon the depth 1218 being smaller than the depth 1118. In some embodiments, a sensor implemented via the semiconductor device 1300 shown in FIG. 13 has less dark current and/or noise compared to a sensor implemented via the semiconductor device 1200 shown in FIG. 12 based upon the depth 1318 being smaller than the depth 1218. In some embodiments, one or more parameters other than the first doped region depth are constant across the semiconductor devices shown in FIGS. 11-13. In some embodiments, the one or more parameters include at least one of a dopant concentration of a doped region, photodiode depth, epitaxial layer dopant concentration, trench isolation structure depth, or other parameter.

Figure 14:
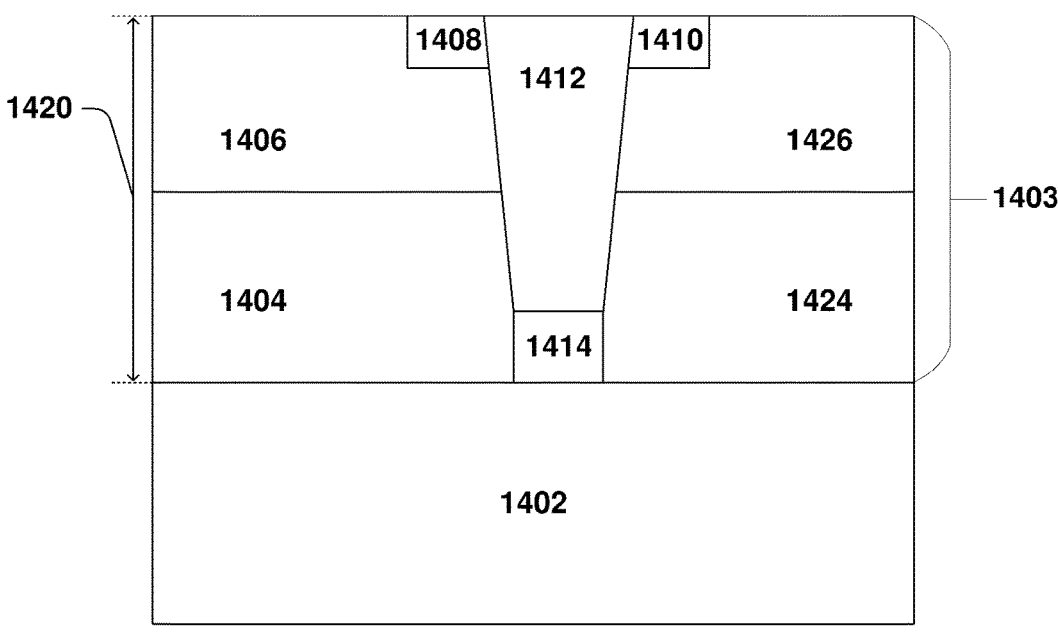
FIG. 14 illustrates a cross-sectional view of a semiconductor device, in accordance with some embodiments.

FIG. 14 illustrates a semiconductor device 1400 according to some embodiments. In some embodiments, the semiconductor device 1400 is formed using one or more of the techniques provided herein with respect to forming the semiconductor device 100 (shown in FIGS. 1-10B). In some embodiments, a component of the semiconductor device 1400 includes at least some of the features, relationships with other elements, etc. provided herein with respect to the semiconductor device 100 (shown in FIGS. 1-10B). In some embodiments, a component of the semiconductor device 1400 has and/or satisfies one, some, and/or all of the relationships provided herein with respect to at least one of the first threshold proportion, the first threshold depth, the second threshold proportion, or the third threshold proportion.

In some embodiments, the semiconductor device 1400 comprises at least one of a substrate 1402 (such as the substrate 102 of the semiconductor device 100), a first epitaxial layer 1403 (such as the first epitaxial layer 202 of the semiconductor device 100) over the substrate 1402, a first photodiode, a second photodiode, or a first trench isolation structure 1412 between the first photodiode and the second photodiode. In some embodiments, the first photodiode comprises at least one of a first doped region 1408 (such as the first doped region 702 of the semiconductor device 100) having the first conductivity type, a second doped region 1404 (such as the third doped region 902 of the semiconductor device 100) having the second conductivity type, or a third doped region 1406 (such as the fifth doped region 1002 of the semiconductor device 100) having the first conductivity type. In some embodiments, the second photodiode comprises at least one of a fourth doped region 1410 (such as the second doped region 704 of the semiconductor device 100) having the first conductivity type, a fifth doped region 1424 (such as the fourth doped region 904 of the semiconductor device 100) having the second conductivity type, or a sixth doped region 1426 (such as the sixth doped region 1004 of the semiconductor device 100) having the first conductivity type. In some embodiments, the first trench isolation structure 1412 overlies a portion 1414 of the first epitaxial layer 1403. In some embodiments, the portion 1414 is between the second doped region 1404 and the fifth doped region 1424. In some embodiments, the first conductivity type is p-type and the second conductivity type is n-type. Embodiments are contemplated in which the first conductivity type is n-type and the second conductivity type is p-type.

In some embodiments, the substrate 1402 comprises dopants having the first conductivity type. In some embodiments, a dopant concentration of dopants having the first conductivity type in the portion 1414 of the first epitaxial layer 1403 is less than at least one of (i) a dopant concentration of dopants having the first conductivity type in the first doped region 1408, (ii) a dopant concentration of dopants having the first conductivity type in the third doped region 1406, (iii) a dopant concentration of dopants having the first conductivity type in the fourth doped region 1410, or (iv) a dopant concentration of dopants having the first conductivity type in the sixth doped region 1426. In some embodiments, the dopant concentration of dopants having the first conductivity type in the first doped region 1408 is greater than the dopant concentration of dopants having the first conductivity type in the third doped region 1406. In some embodiments, the dopant concentration of dopants having the first conductivity type in the fourth doped region 1410 is greater than the dopant concentration of dopants having the first conductivity type in the sixth doped region 1426.

In some embodiments, at least one of (i) the first epitaxial layer 1403 is formed using one or more of the techniques provided herein with respect to forming the first epitaxial layer 202 of the semiconductor device 100, (ii) the first trench isolation structure 1412 is formed using one or more of the techniques provided herein with respect to forming the first trench isolation structure 402 of the semiconductor device 100, (iii) the first doped region 1408 is formed using one or more of the techniques provided herein with respect to forming the first doped region 702 of the semiconductor device 100, (iv) the third doped region 1406 is formed using one or more of the techniques provided herein with respect to forming the fifth doped region 1002 of the semiconductor device 100, (v) the fourth doped region 1410 is formed using one or more of the techniques provided herein with respect to forming the second doped region 704 of the semiconductor device 100, (vi) the fifth doped region 1424 is formed using one or more of the techniques provided herein with respect to forming the fourth doped region 904 of the semiconductor device 100, or (vii) the sixth doped region 1426 is formed using one or more of the techniques provided herein with respect to forming the sixth doped region 1004 of the semiconductor device 100.

Figure 15:
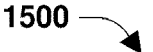
FIG. 15 illustrates a cross-sectional view of a semiconductor device, in accordance with some embodiments.
Figure 15:
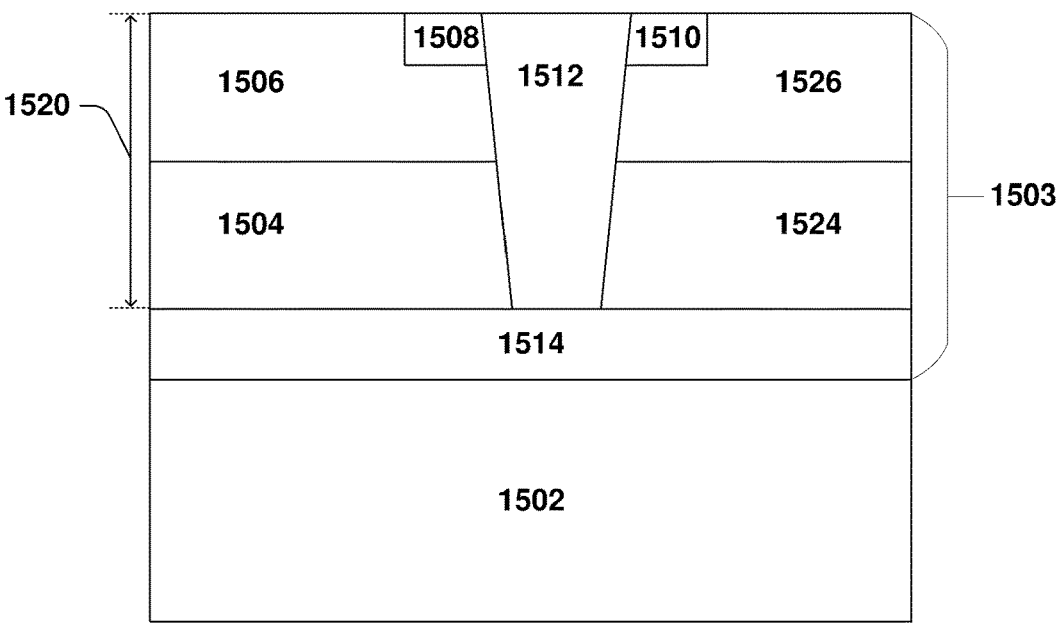

FIG. 15 illustrates a semiconductor device 1500 according to some embodiments. In some embodiments, the semiconductor device 1500 is formed using one or more of the techniques provided herein with respect to forming the semiconductor device 100 (shown in FIGS. 1-10B). In some embodiments, a component of the semiconductor device 1500 includes at least some of the features, relationships with other elements, etc. provided herein with respect to the semiconductor device 100 (shown in FIGS. 1-10B). In some embodiments, a component of the semiconductor device 1500 has and/or satisfies one, some, and/or all of the relationships provided herein with respect to at least one of the first threshold proportion, the first threshold depth, the second threshold proportion, or the third threshold proportion.

In some embodiments, the semiconductor device 1500 comprises at least one of a substrate 1502 (such as the substrate 102 of the semiconductor device 100), a first epitaxial layer 1503 (such as the first epitaxial layer 202 of the semiconductor device 100) over the substrate 1502, a first photodiode, a second photodiode, or a first trench isolation structure 1512 between the first photodiode and the second photodiode. In some embodiments, the first photodiode comprises at least one of a first doped region 1508 (such as the first doped region 702 of the semiconductor device 100) having the first conductivity type, a second doped region 1504 (such as the third doped region 902 of the semiconductor device 100) having the second conductivity type, or a third doped region 1506 (such as the fifth doped region 1002 of the semiconductor device 100) having the first conductivity type. In some embodiments, the second photodiode comprises at least one of a fourth doped region 1510 (such as the second doped region 704 of the semiconductor device 100) having the first conductivity type, a fifth doped region 1524 (such as the fourth doped region 904 of the semiconductor device 100) having the second conductivity type, or a sixth doped region 1526 (such as the sixth doped region 1004 of the semiconductor device 100) having the first conductivity type. In some embodiments, the first trench isolation structure 1512 overlies a portion 1514 of the first epitaxial layer 1503. In some embodiments, the first conductivity type is p-type and the second conductivity type is n-type. Embodiments are contemplated in which the first conductivity type is n-type and the second conductivity type is p-type.

In some embodiments, the substrate 1502 comprises dopants having the first conductivity type. In some embodiments, a dopant concentration of dopants having the first conductivity type in the portion 1514 of the first epitaxial layer 1503 is less than at least one of (i) a dopant concentration of dopants having the first conductivity type in the first doped region 1508, (ii) a dopant concentration of dopants having the first conductivity type in the third doped region 1506, (iii) a dopant concentration of dopants having the first conductivity type in the fourth doped region 1510, or (iv) a dopant concentration of dopants having the first conductivity type in the sixth doped region 1526. In some embodiments, the dopant concentration of dopants having the first conductivity type in the first doped region 1508 is greater than the dopant concentration of dopants having the first conductivity type in the third doped region 1506. In some embodiments, the dopant concentration of dopants having the first conductivity type in the fourth doped region 1510 is greater than the dopant concentration of dopants having the first conductivity type in the sixth doped region 1526.

In some embodiments, at least one of (i) the first epitaxial layer 1503 is formed using one or more of the techniques provided herein with respect to forming the first epitaxial layer 202 of the semiconductor device 100, (ii) the first trench isolation structure 1512 is formed using one or more of the techniques provided herein with respect to forming the first trench isolation structure 402 of the semiconductor device 100, (iii) the first doped region 1508 is formed using one or more of the techniques provided herein with respect to forming the first doped region 702 of the semiconductor device 100, (iv) the third doped region 1506 is formed using one or more of the techniques provided herein with respect to forming the fifth doped region 1002 of the semiconductor device 100, (v) the fourth doped region 1510 is formed using one or more of the techniques provided herein with respect to forming the second doped region 704 of the semiconductor device 100, (vi) the fifth doped region 1524 is formed using one or more of the techniques provided herein with respect to forming the fourth doped region 904 of the semiconductor device 100, or (vii) the sixth doped region 1526 is formed using one or more of the techniques provided herein with respect to forming the sixth doped region 1004 of the semiconductor device 100.

In some embodiments, the portion 1514 of the first epitaxial layer 1503 separates the substrate 1502 from at least one of the second doped region 1504, the first trench isolation structure 1512, or the fifth doped region 1524.

Figure 16:
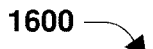
FIG. 16 illustrates a cross-sectional view of a semiconductor device, in accordance with some embodiments.
Figure 16:
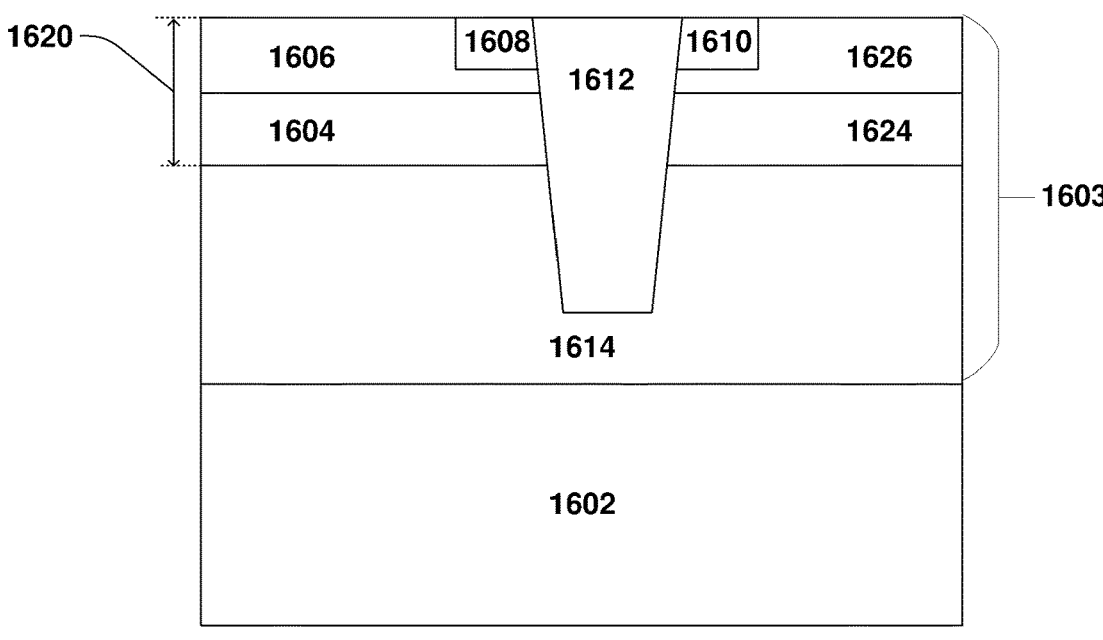

FIG. 16 illustrates a semiconductor device 1600 according to some embodiments. In some embodiments, the semiconductor device 1600 is formed using one or more of the techniques provided herein with respect to forming the semiconductor device 100 (shown in FIGS. 1-10B). In some embodiments, a component of the semiconductor device 1600 includes at least some of the features, relationships with other elements, etc. provided herein with respect to the semiconductor device 100 (shown in FIGS. 1-10B). In some embodiments, a component of the semiconductor device 1600 has and/or satisfies one, some, and/or all of the relationships provided herein with respect to at least one of the first threshold proportion, the first threshold depth, the second threshold proportion, or the third threshold proportion.

In some embodiments, the semiconductor device 1600 comprises at least one of a substrate 1602 (such as the substrate 102 of the semiconductor device 100), a first epitaxial layer 1603 (such as the first epitaxial layer 202 of the semiconductor device 100) over the substrate 1602, a first photodiode, a second photodiode, or a first trench isolation structure 1612 between the first photodiode and the second photodiode. In some embodiments, the first photodiode comprises at least one of a first doped region 1608 (such as the first doped region 702 of the semiconductor device 100) having the first conductivity type, a second doped region 1604 (such as the third doped region 902 of the semiconductor device 100) having the second conductivity type, or a third doped region 1606 (such as the fifth doped region 1002 of the semiconductor device 100) having the first conductivity type. In some embodiments, the second photodiode comprises at least one of a fourth doped region 1610 (such as the second doped region 704 of the semiconductor device 100) having the first conductivity type, a fifth doped region 1624 (such as the fourth doped region 904 of the semiconductor device 100) having the second conductivity type, or a sixth doped region 1626 (such as the sixth doped region 1004 of the semiconductor device 100) having the first conductivity type. In some embodiments, the first trench isolation structure 1612 overlies a portion 1614 of the first epitaxial layer 1603. In some embodiments, the first conductivity type is p-type and the second conductivity type is n-type. Embodiments are contemplated in which the first conductivity type is n-type and the second conductivity type is p-type.

In some embodiments, the substrate 1602 comprises dopants having the first conductivity type. In some embodiments, a dopant concentration of dopants having the first conductivity type in the portion 1614 of the first epitaxial layer 1603 is less than at least one of (i) a dopant concentration of dopants having the first conductivity type in the first doped region 1608, (ii) a dopant concentration of dopants having the first conductivity type in the third doped region 1606, (iii) a dopant concentration of dopants having the first conductivity type in the fourth doped region 1610, or (iv) a dopant concentration of dopants having the first conductivity type in the sixth doped region 1626. In some embodiments, the dopant concentration of dopants having the first conductivity type in the first doped region 1608 is greater than the dopant concentration of dopants having the first conductivity type in the third doped region 1606. In some embodiments, the dopant concentration of dopants having the first conductivity type in the fourth doped region 1610 is greater than the dopant concentration of dopants having the first conductivity type in the sixth doped region 1626.

In some embodiments, at least one of (i) the first epitaxial layer 1603 is formed using one or more of the techniques provided herein with respect to forming the first epitaxial layer 202 of the semiconductor device 100, (ii) the first trench isolation structure 1612 is formed using one or more of the techniques provided herein with respect to forming the first trench isolation structure 402 of the semiconductor device 100, (iii) the first doped region 1608 is formed using one or more of the techniques provided herein with respect to forming the first doped region 702 of the semiconductor device 100, (iv) the third doped region 1606 is formed using one or more of the techniques provided herein with respect to forming the fifth doped region 1002 of the semiconductor device 100, (v) the fourth doped region 1610 is formed using one or more of the techniques provided herein with respect to forming the second doped region 704 of the semiconductor device 100, (vi) the fifth doped region 1624 is formed using one or more of the techniques provided herein with respect to forming the fourth doped region 904 of the semiconductor device 100, or (vii) the sixth doped region 1626 is formed using one or more of the techniques provided herein with respect to forming the sixth doped region 1004 of the semiconductor device 100.

In some embodiments, the portion 1614 of the first epitaxial layer 1603 separates the substrate 1602 from at least one of the second doped region 1604, the first trench isolation structure 1612, or the fifth doped region 1624. In some embodiments, an uppermost portion of the portion 1614 of the first epitaxial layer 1603 is over a lowermost portion of the first trench isolation structure 1612.

In some embodiments, an amount of dark current generated in a sensor implemented using one or more of the techniques provided herein is dependent upon a first photodiode depth of the sensor. In some embodiments, the first photodiode depth corresponds to at least one of the fifth depth 906 of the second sidewall 924 of the third doped region 902 of the semiconductor device 100 shown in FIG. 9, a photodiode depth 1420 of the first photodiode shown in FIG. 14, a photodiode depth 1520 of the first photodiode shown in FIG. 15, or a photodiode depth 1620 of the first photodiode shown in FIG. 16. In some embodiments, decreasing the first photodiode depth provides for reduced dark current generated in the sensor, thereby providing for improved accuracy and/or resolution of the sensor. In some embodiments, a sensor implemented via the semiconductor device 1500 shown in FIG. 15 has less dark current and/or noise compared to a sensor implemented via the semiconductor device 1400 shown in FIG. 14 based upon the photodiode depth 1520 being smaller than the photodiode depth 1420. In some embodiments, a sensor implemented via the semiconductor device 1600 shown in FIG. 16 has less dark current and/or noise compared to a sensor implemented via the semiconductor device 1500 shown in FIG. 15 based upon the photodiode depth 1620 being smaller than the photodiode depth 1520. In some embodiments, one or more parameters other than the first photodiode depth are constant across the semiconductor devices shown in FIGS. 14-16. In some embodiments, the one or more parameters include at least one of the first doped region depth, a dopant concentration of a doped region, epitaxial layer dopant concentration, trench isolation structure depth, or other parameter.

Figure 17:
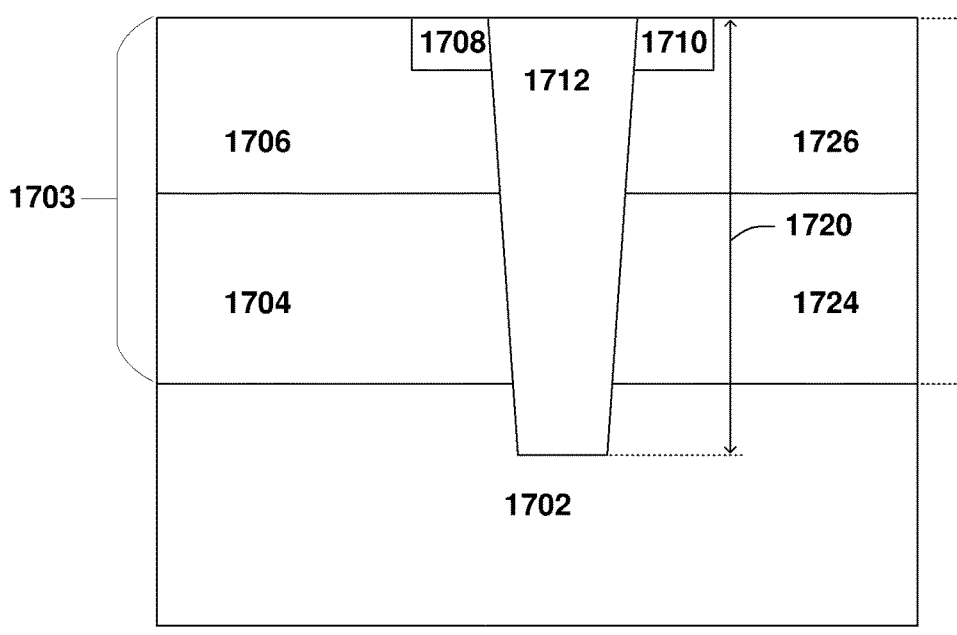
FIG. 17 illustrates a cross-sectional view of a semiconductor device, in accordance with some embodiments.

FIG. 17 illustrates a semiconductor device 1700 according to some embodiments. In some embodiments, the semiconductor device 1700 is formed using one or more of the techniques provided herein with respect to forming the semiconductor device 100 (shown in FIGS. 1-10B). In some embodiments, a component of the semiconductor device 1700 includes at least some of the features, relationships with other elements, etc. provided herein with respect to the semiconductor device 100 (shown in FIGS. 1-10B). In some embodiments, a component of the semiconductor device 1700 has and/or satisfies one, some, and/or all of the relationships provided herein with respect to at least one of the first threshold proportion, the first threshold depth, the second threshold proportion, or the third threshold proportion.

In some embodiments, the semiconductor device 1700 comprises at least one of a substrate 1702 (such as the substrate 102 of the semiconductor device 100), a first epitaxial layer 1703 (such as the first epitaxial layer 202 of the semiconductor device 100) over the substrate 1702, a first photodiode, a second photodiode, or a first trench isolation structure 1712 between the first photodiode and the second photodiode. In some embodiments, the first photodiode comprises at least one of a first doped region 1708 (such as the first doped region 702 of the semiconductor device 100) having the first conductivity type, a second doped region 1704 (such as the third doped region 902 of the semiconductor device 100) having the second conductivity type, or a third doped region 1706 (such as the fifth doped region 1002 of the semiconductor device 100) having the first conductivity type. In some embodiments, the second photodiode comprises at least one of a fourth doped region 1710 (such as the second doped region 704 of the semiconductor device 100) having the first conductivity type, a fifth doped region 1724 (such as the fourth doped region 904 of the semiconductor device 100) having the second conductivity type, or a sixth doped region 1726 (such as the sixth doped region 1004 of the semiconductor device 100) having the first conductivity type. In some embodiments, a bottom sidewall of the first trench isolation structure 1712 is under an uppermost surface of the substrate 1702. In some embodiments, the first conductivity type is p-type and the second conductivity type is n-type. Embodiments are contemplated in which the first conductivity type is n-type and the second conductivity type is p-type.

In some embodiments, the substrate 1702 comprises dopants having the first conductivity type. In some embodiments, a dopant concentration of dopants having the first conductivity type in the first doped region 1708 is greater than a dopant concentration of dopants having the first conductivity type in the third doped region 1706. In some embodiments, a dopant concentration of dopants having the first conductivity type in the fourth doped region 1710 is greater than a dopant concentration of dopants having the first conductivity type in the sixth doped region 1726.

In some embodiments, at least one of (i) the first epitaxial layer 1703 is formed using one or more of the techniques provided herein with respect to forming the first epitaxial layer 202 of the semiconductor device 100, (ii) the first trench isolation structure 1712 is formed using one or more of the techniques provided herein with respect to forming the first trench isolation structure 402 of the semiconductor device 100, (iii) the first doped region 1708 is formed using one or more of the techniques provided herein with respect to forming the first doped region 702 of the semiconductor device 100, (iv) the third doped region 1706 is formed using one or more of the techniques provided herein with respect to forming the fifth doped region 1002 of the semiconductor device 100, (v) the fourth doped region 1710 is formed using one or more of the techniques provided herein with respect to forming the second doped region 704 of the semiconductor device 100, (vi) the fifth doped region 1724 is formed using one or more of the techniques provided herein with respect to forming the fourth doped region 904 of the semiconductor device 100, or (vii) the sixth doped region 1726 is formed using one or more of the techniques provided herein with respect to forming the sixth doped region 1004 of the semiconductor device 100.

Figure 18:
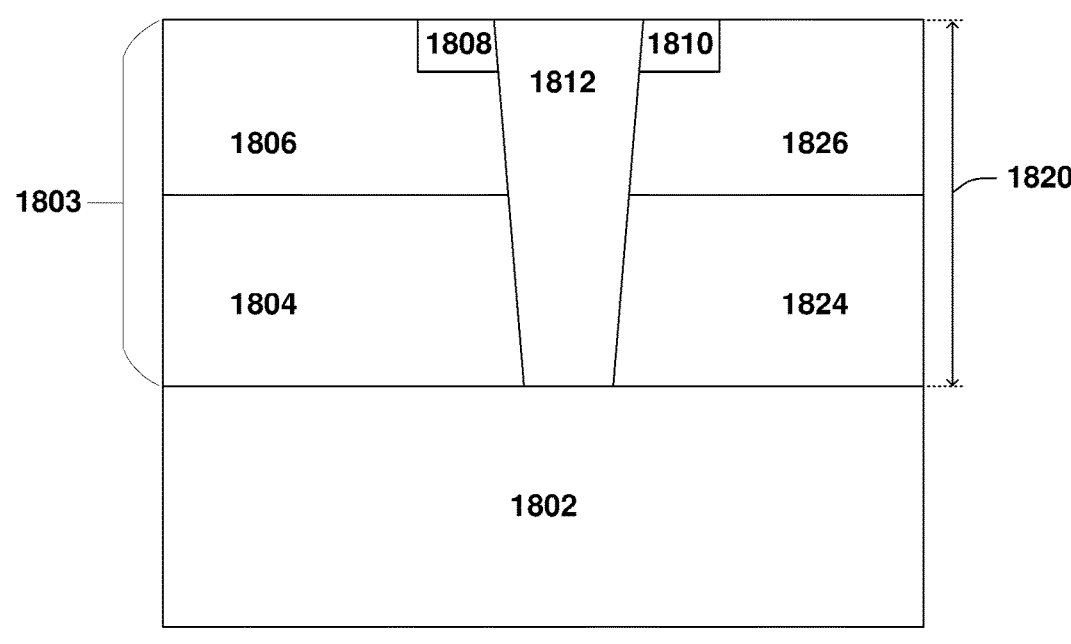
FIG. 18 illustrates a cross-sectional view of a semiconductor device, in accordance with some embodiments.

FIG. 18 illustrates a semiconductor device 1800 according to some embodiments. In some embodiments, the semiconductor device 1800 is formed using one or more of the techniques provided herein with respect to forming the semiconductor device 100 (shown in FIGS. 1-10B). In some embodiments, a component of the semiconductor device 1800 includes at least some of the features, relationships with other elements, etc. provided herein with respect to the semiconductor device 100 (shown in FIGS. 1-10B). In some embodiments, a component of the semiconductor device

1800 has and/or satisfies one, some, and/or all of the relationships provided herein with respect to at least one of the first threshold proportion, the first threshold depth, the second threshold proportion, or the third threshold proportion.

In some embodiments, the semiconductor device 1800 comprises at least one of a substrate 1802 (such as the substrate 102 of the semiconductor device 100), a first epitaxial layer 1803 (such as the first epitaxial layer 202 of the semiconductor device 100) over the substrate 1802, a first photodiode, a second photodiode, or a first trench isolation structure 1812 between the first photodiode and the second photodiode. In some embodiments, the first photodiode comprises at least one of a first doped region 1808 (such as the first doped region 702 of the semiconductor device 100) having the first conductivity type, a second doped region 1804 (such as the third doped region 902 of the semiconductor device 100) having the second conductivity type, or a third doped region 1806 (such as the fifth doped region 1002 of the semiconductor device 100) having the first conductivity type. In some embodiments, the second photodiode comprises at least one of a fourth doped region 1810 (such as the second doped region 704 of the semiconductor device 100) having the first conductivity type, a fifth doped region 1824 (such as the fourth doped region 904 of the semiconductor device 100) having the second conductivity type, or a sixth doped region 1826 (such as the sixth doped region 1004 of the semiconductor device 100) having the first conductivity type. In some embodiments, a bottom sidewall of the first trench isolation structure 1812 is at least one of adjacent or aligned with a surface of the substrate 1802. In some embodiments, the first conductivity type is p-type and the second conductivity type is n-type. Embodiments are contemplated in which the first conductivity type is n-type and the second conductivity type is p-type.

In some embodiments, the substrate 1802 comprises dopants having the first conductivity type. In some embodiments, a dopant concentration of dopants having the first conductivity type in the first doped region 1808 is greater than a dopant concentration of dopants having the first conductivity type in the third doped region 1806. In some embodiments, a dopant concentration of dopants having the first conductivity type in the fourth doped region 1810 is greater than a dopant concentration of dopants having the first conductivity type in the sixth doped region 1826.

In some embodiments, at least one of (i) the first epitaxial layer 1803 is formed using one or more of the techniques provided herein with respect to forming the first epitaxial layer 202 of the semiconductor device 100, (ii) the first trench isolation structure 1812 is formed using one or more of the techniques provided herein with respect to forming the first trench isolation structure 402 of the semiconductor device 100, (iii) the first doped region 1808 is formed using one or more of the techniques provided herein with respect to forming the first doped region 702 of the semiconductor device 100, (iv) the third doped region 1806 is formed using one or more of the techniques provided herein with respect to forming the fifth doped region 1002 of the semiconductor device 100, (v) the fourth doped region 1810 is formed using one or more of the techniques provided herein with respect to forming the second doped region 704 of the semiconductor device 100, (vi) the fifth doped region 1824 is formed using one or more of the techniques provided herein with respect to forming the fourth doped region 904 of the semiconductor device 100, or (vii) the sixth doped region 1826 is formed using one or more of the techniques provided herein with respect to forming the sixth doped region 1004 of the semiconductor device 100.

Figure 19:
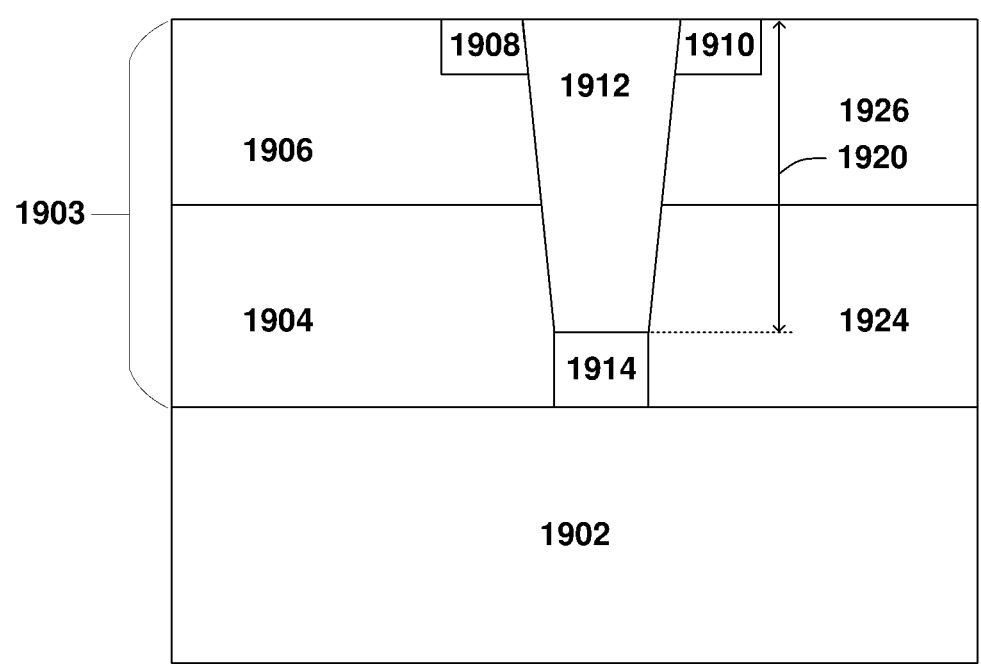
FIG. 19 illustrates a cross-sectional view of a semiconductor device, in accordance with some embodiments.

FIG. 19 illustrates a semiconductor device 1900 according to some embodiments. In some embodiments, the semiconductor device 1900 is formed using one or more of the techniques provided herein with respect to forming the semiconductor device 100 (shown in FIGS. 1-10B). In some embodiments, a component of the semiconductor device 1900 includes at least some of the features, relationships with other elements, etc. provided herein with respect to the semiconductor device 100 (shown in FIGS. 1-10B). In some embodiments, a component of the semiconductor device 1900 has and/or satisfies one, some, and/or all of the relationships provided herein with respect to at least one of the first threshold proportion, the first threshold depth, the second threshold proportion, or the third threshold proportion.

In some embodiments, the semiconductor device 1900 comprises at least one of a substrate 1902 (such as the substrate 102 of the semiconductor device 100), a first epitaxial layer 1903 (such as the first epitaxial layer 202 of the semiconductor device 100) over the substrate 1902, a first photodiode, a second photodiode, or a first trench isolation structure 1912 between the first photodiode and the second photodiode. In some embodiments, the first photodiode comprises at least one of a first doped region 1908 (such as the first doped region 702 of the semiconductor device 100) having the first conductivity type, a second doped region 1904 (such as the third doped region 902 of the semiconductor device 100) having the second conductivity type, or a third doped region 1906 (such as the fifth doped region 1002 of the semiconductor device 100) having the first conductivity type. In some embodiments, the second photodiode comprises at least one of a fourth doped region 1910 (such as the second doped region 704 of the semiconductor device 100) having the first conductivity type, a fifth doped region 1924 (such as the fourth doped region 904 of the semiconductor device 100) having the second conductivity type, or a sixth doped region 1926 (such as the sixth doped region 1004 of the semiconductor device 100) having the first conductivity type. In some embodiments, a bottom sidewall of the first trench isolation structure 1912 overlies a portion 1914 of the first epitaxial layer 1903. In some embodiments, the portion 1914 is between the second doped region 1904 and the fifth doped region 1924. In some embodiments, the first conductivity type is p-type and the second conductivity type is n-type. Embodiments are contemplated in which the first conductivity type is n-type and the second conductivity type is p-type.

In some embodiments, the substrate 1902 comprises dopants having the first conductivity type. In some embodiments, a dopant concentration of dopants having the first conductivity type in the portion 1914 of the first epitaxial layer 1903 is less than at least one of (i) a dopant concentration of dopants having the first conductivity type in the first doped region 1908, (ii) a dopant concentration of dopants having the first conductivity type in the third doped region 1906, (iii) a dopant concentration of dopants having the first conductivity type in the fourth doped region 1910, or (iv) a dopant concentration of dopants having the first conductivity type in the sixth doped region 1926. In some embodiments, the dopant concentration of dopants having the first conductivity type in the first doped region 1908 is greater than the dopant concentration of dopants having the first conductivity type in the third doped region 1906. In some embodiments, the dopant concentration of dopants having the first conductivity type in the fourth doped region

1910 is greater than the dopant concentration of dopants having the first conductivity type in the sixth doped region 1926.

In some embodiments, at least one of (i) the first epitaxial layer 1903 is formed using one or more of the techniques provided herein with respect to forming the first epitaxial layer 202 of the semiconductor device 100, (ii) the first trench isolation structure 1912 is formed using one or more of the techniques provided herein with respect to forming the first trench isolation structure 402 of the semiconductor device 100, (iii) the first doped region 1908 is formed using one or more of the techniques provided herein with respect to forming the first doped region 702 of the semiconductor device 100, (iv) the third doped region 1906 is formed using one or more of the techniques provided herein with respect to forming the fifth doped region 1002 of the semiconductor device 100, (v) the fourth doped region 1910 is formed using one or more of the techniques provided herein with respect to forming the second doped region 704 of the semiconductor device 100, (vi) the fifth doped region 1924 is formed using one or more of the techniques provided herein with respect to forming the fourth doped region 904 of the semiconductor device 100, or (vii) the sixth doped region 1926 is formed using one or more of the techniques provided herein with respect to forming the sixth doped region 1004 of the semiconductor device 100.

In some embodiments, an amount of dark current generated in a sensor implemented using one or more of the techniques provided herein is dependent upon a first trench isolation structure depth of the sensor. In some embodiments, the first trench isolation structure depth corresponds to at least one of the first depth 406 of the second sidewall 414 of the first trench isolation structure 402 of the semiconductor device 100 shown in FIG. 4, a trench isolation structure depth 1720 of the first trench isolation structure 1712 shown in FIG. 17, a trench isolation structure depth 1820 of the first trench isolation structure 1812 shown in FIG. 18, or a trench isolation structure depth 1920 of the first trench isolation structure 1912 shown in FIG. 19. In some embodiments, decreasing the first trench isolation structure depth provides for reduced dark current generated in the sensor, thereby providing for improved accuracy and/or resolution of the sensor. In some embodiments, a sensor implemented via the semiconductor device 1800 shown in FIG. 18 has less dark current and/or noise compared to a sensor implemented via the semiconductor device 1700 shown in FIG. 17 based upon the trench isolation structure depth 1820 being smaller than the trench isolation structure depth 1720. In some embodiments, a sensor implemented via the semiconductor device 1900 shown in FIG. 19 has less dark current and/or noise compared to a sensor implemented via the semiconductor device 1800 shown in FIG. 18 based upon the trench isolation structure depth 1920 being smaller than the trench isolation structure depth 1820. In some embodiments, one or more parameters other than the first trench isolation structure depth are constant across the semiconductor devices shown in FIGS. 17-19. In some embodiments, the one or more parameters include at least one of the first photodiode depth, the first doped region depth, a dopant concentration of a doped region, epitaxial layer dopant concentration, or other parameter.

In some embodiments, an amount of dark current generated in a sensor implemented using one or more of the techniques provided herein is dependent upon a first epitaxial dopant concentration parameter associated with the sensor. In some embodiments, the first epitaxial dopant concentration parameter corresponds to a dopant concentration of dopants having the first conductivity type in an epitaxial region of a first epitaxial layer. In some embodiments, the epitaxial region corresponds to a region outside of a doped region of a photodiode in the first epitaxial layer. In some embodiments, the epitaxial region corresponds to at least one of a region comprising the portion 914 of the first epitaxial layer 202 of the semiconductor device 100 shown in FIG. 9, a region comprising the portion 1114 of the first epitaxial layer 1103 of the semiconductor device 1100 shown in FIG. 11, a region comprising the portion 1214 of the first epitaxial layer 1203 of the semiconductor device 1200 shown in FIG. 12, a region comprising the portion 1314 of the first epitaxial layer 1303 of the semiconductor device 1300 shown in FIG. 13, a region comprising the portion 1414 of the first epitaxial layer 1303 of the semiconductor device 1400 shown in FIG. 14, a region comprising the portion 1514 of the first epitaxial layer 1503 of the semiconductor device 1500 shown in FIG. 15, a region comprising the portion 1614 of the first epitaxial layer 1603 of the semiconductor device 1600 shown in FIG. 16, or a region comprising the portion 1914 of the first epitaxial layer 1903 of the semiconductor device 1900 shown in FIG. 19. In some embodiments, increasing the first epitaxial dopant concentration parameter provides for reduced dark current generated in the sensor, thereby providing for improved accuracy and/or resolution of the sensor.

In some embodiments, a semiconductor device is provided. The semiconductor device includes a substrate and a first epitaxial layer over the substrate. The semiconductor device includes a first photodiode and a second photodiode in the first epitaxial layer. The semiconductor device includes a trench isolation structure between the first photodiode and the second photodiode. The first photodiode includes a first doped region having a first conductivity type. The first photodiode includes a second doped region, overlying the first doped region, having a second conductivity type different than the first conductivity type. The first photodiode includes a third doped region, overlying the first doped region, having the second conductivity type. A first sidewall of the third doped region is adjacent a first portion of a first sidewall of the trench isolation structure. The first sidewall of the third doped region extends from a second sidewall of the third doped region to a third sidewall, of the third doped region, under the second sidewall of the third doped region. The first sidewall of the trench isolation structure extends from a second sidewall of the trench isolation structure to a third sidewall, of the trench isolation structure, under the second sidewall of the trench isolation structure. A first distance between the third sidewall of the third doped region and an uppermost surface of the first epitaxial layer is between about a hundredth to about a fifth of a second distance between the third sidewall of the trench isolation structure and the uppermost surface of the first epitaxial layer.

In some embodiments, a method for forming a semiconductor device is provided. The method includes forming a first epitaxial layer over a substrate. The method includes forming a trench isolation structure in the first epitaxial layer. The method includes forming, in the first epitaxial layer, a first doped region of a photodiode, wherein the first doped region has a first conductivity type. The method includes forming, in the first epitaxial layer and under the first doped region, a second doped region of the photodiode, wherein the second doped region of the photodiode has a second conductivity type different than the first conductivity type. The method includes forming, in the first epitaxial layer and over the second doped region, a third doped region of the photodiode, wherein the third doped region of the photodiode has the first conductivity type. Forming the first doped region includes forming the first doped region to have a bottom sidewall at a first depth relative to an uppermost surface of the first epitaxial layer. Forming the trench isolation structure includes forming the trench isolation structure to have a bottom sidewall at a second depth relative to the uppermost surface of the first epitaxial layer. The first depth is between about a hundredth to about a fifth of the second depth.

In some embodiments, a semiconductor device is provided. The semiconductor device includes a semiconductor body. The semiconductor device includes a first photodiode and a second photodiode in the semiconductor body. The semiconductor device includes a trench isolation structure between the first photodiode and the second photodiode. The first photodiode includes a first doped region having a first conductivity type. The first photodiode includes a second doped region, overlying the first doped region, having a second conductivity type different than the first conductivity type. The first photodiode includes a third doped region, overlying the first doped region, having the second conductivity type. A first sidewall of the third doped region is adjacent a first portion of a first sidewall of the trench isolation structure. The first sidewall of the third doped region extends from a second sidewall of the third doped region to a third sidewall, of the third doped region, under the second sidewall of the third doped region. The first sidewall of the trench isolation structure extends from a second sidewall of the trench isolation structure to a third sidewall, of the trench isolation structure, under the second sidewall of the trench isolation structure. A first distance between the third sidewall of the third doped region and a surface of the semiconductor body is between about a hundredth to about a fifth of a second distance between the third sidewall of the trench isolation structure and the surface of the semiconductor body.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" and/or the like is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
a substrate;
a first epitaxial layer over the substrate;
a first photodiode and a second photodiode in the first epitaxial layer; and
a trench isolation structure between the first photodiode and the second photodiode, wherein:
the first photodiode comprises:
a first doped region having a first conductivity type;
a second doped region, overlying the first doped region, having a second conductivity type different than the first conductivity type; and a third doped region, overlying the first doped region, having the second conductivity type;
a first sidewall of the third doped region is adjacent a first portion of a first sidewall of the trench isolation structure;
the first sidewall of the third doped region extends from a second sidewall of the third doped region to a third sidewall, of the third doped region, under the second sidewall of the third doped region;
the first sidewall of the trench isolation structure extends from a second sidewall of the trench isolation structure to a third sidewall, of the trench isolation structure, under the second sidewall of the trench isolation structure; and
a first distance between the third sidewall of the third doped region and an uppermost surface of the first epitaxial layer is between about a hundredth to about a fifth of a second distance between the third sidewall of the trench isolation structure and the uppermost surface of the first epitaxial layer.

2. The semiconductor device of claim 1, wherein:
a first concentration of first dopants of the second conductivity type in the third doped region is greater than a second concentration of second dopants of the second conductivity type in the second doped region.

3. The semiconductor device of claim 1, wherein:
the second sidewall of the third doped region is coplanar with the second sidewall of the trench isolation structure.

4. The semiconductor device of claim 1, wherein:
the second sidewall of the third doped region comprises a portion of the uppermost surface of the first epitaxial layer.

5. The semiconductor device of claim 1, wherein:
a sidewall of the second doped region is adjacent a second portion of the first sidewall of the trench isolation structure; and
the second portion of the first sidewall of the trench isolation structure is under the first portion of the first sidewall of the trench isolation structure.

6. The semiconductor device of claim 5, wherein:
a sidewall of the first doped region is adjacent a third portion of the first sidewall of the trench isolation structure; and
the third portion of the first sidewall of the trench isolation structure is under the second portion of the first sidewall of the trench isolation structure.

7. The semiconductor device of claim 1, wherein:
the first sidewall of the trench isolation structure is tapered.

8. The semiconductor device of claim 1, wherein:
the second photodiode comprises:
a fourth doped region having the first conductivity type;
a fifth doped region, overlying the fourth doped region, having the second conductivity type; and
a sixth doped region, overlying the fourth doped region, having the second conductivity type;
the trench isolation structure comprises a fourth sidewall, opposite the first sidewall of the trench isolation structure, extending from the second sidewall of the trench isolation structure to the third sidewall of the trench isolation structure;
a first sidewall of the sixth doped region is adjacent a first portion of the fourth sidewall of the trench isolation structure;
the first sidewall of the sixth doped region extends from a second sidewall of the sixth doped region to a third sidewall, of the sixth doped region, under the second sidewall of the sixth doped region; and a third distance between the third sidewall of the sixth doped region and the uppermost surface of the first epitaxial layer is between about a hundredth to about a fifth of the second distance between the third sidewall of the trench isolation structure and the uppermost surface of the first epitaxial layer.

9. The semiconductor device of claim 8, wherein:

a first concentration of first dopants of the second conductivity type in the sixth doped region is greater than a second concentration of second dopants of the second conductivity type in the fifth doped region.

10. The semiconductor device of claim 1, wherein:

the third doped region comprises a fourth sidewall, opposite the first sidewall of the third doped region, extending from the second sidewall of the third doped region to the fourth sidewall of the third doped region;

the second photodiode comprises:

a fourth doped region having the first conductivity type;

a fifth doped region, overlying the fourth doped region, having the second conductivity type; and a sixth doped region, overlying the fourth doped region, having the second conductivity type;

the trench isolation structure comprises a fourth sidewall, opposite the first sidewall of the trench isolation structure, extending from the second sidewall of the trench isolation structure to the third sidewall of the trench isolation structure;

a first sidewall of the sixth doped region is adjacent a first portion of the fourth sidewall of the trench isolation structure;

the first sidewall of the sixth doped region extends from a second sidewall of the sixth doped region to a third sidewall, of the sixth doped region, under the second sidewall of the sixth doped region;

the sixth doped region comprises a fourth sidewall, opposite the first sidewall of the sixth doped region, extending from the second sidewall of the sixth doped region to the third sidewall of the sixth doped region; and a third distance between the fourth sidewall of the third doped region and the fourth sidewall of the sixth doped region is at most about seven times a fourth distance between the first portion of the first sidewall of the trench isolation structure and the first portion of the fourth sidewall of the trench isolation structure.

11. The semiconductor device of claim 10, wherein:

the first sidewall of the trench isolation structure is a first tapered sidewall having a first slope;

the fourth sidewall of the trench isolation structure is a second tapered sidewall having a second slope; and the second slope is opposite in polarity relative to the first slope.

12. The semiconductor device of claim 10, wherein:

the third distance is at most about five times the fourth distance.

13. The semiconductor device of claim 1, wherein:

the first distance is between about a hundredth to about a tenth of the second distance.

14. A method of forming a semiconductor device, comprising:

forming a first epitaxial layer over a substrate;

forming a trench isolation structure in the first epitaxial layer;

forming, in the first epitaxial layer, a first doped region of a photodiode, wherein the first doped region has a first conductivity type;

forming, in the first epitaxial layer and under the first doped region, a second doped region of the photodiode, wherein the second doped region of the photodiode has a second conductivity type different than the first conductivity type; and forming, in the first epitaxial layer and over the second doped region, a third doped region of the photodiode, wherein the third doped region of the photodiode has the first conductivity type, wherein:

forming the first doped region comprises forming the first doped region to have a bottom sidewall at a first depth relative to an uppermost surface of the first epitaxial layer;

forming the trench isolation structure comprises forming the trench isolation structure to have a bottom sidewall at a second depth relative to the uppermost surface of the first epitaxial layer; and the first depth is between about a hundredth to about a fifth of the second depth.

15. The method of claim 14, wherein:

forming the first doped region comprises forming the first doped region to comprise a first concentration of first dopants having the first conductivity type;

forming the third doped region comprises forming the third doped region to comprise a second concentration of second dopants having the first conductivity type; and the first concentration is greater than the second concentration.

16. The method of claim 14, wherein:

forming the trench isolation structure comprises forming the trench isolation structure to have a first tapered sidewall having a first slope and a second tapered sidewall having a second slope;

the second slope is opposite in polarity relative to the first slope; and forming the first doped region comprises forming the first doped region to have a tapered sidewall adjacent the first tapered sidewall.

17. The method of claim 14, wherein forming the first doped region comprises:

forming a sacrificial layer over the first epitaxial layer; and implanting dopants, through the sacrificial layer, into a region of the first epitaxial layer.

18. The method of claim 14, wherein:

the first depth is between about a hundredth to about a tenth of the second depth.

19. A semiconductor device, comprising:

a semiconductor body;

a first photodiode and a second photodiode in the semiconductor body; and a trench isolation structure between the first photodiode and the second photodiode, wherein:

the first photodiode comprises:

a first doped region having a first conductivity type;

a second doped region, overlying the first doped region, having a second conductivity type different than the first conductivity type; and a third doped region, overlying the first doped region, having the second conductivity type;

a first sidewall of the third doped region is adjacent a first portion of a first sidewall of the trench isolation structure;

the first sidewall of the third doped region extends from a second sidewall of the third doped region to a third sidewall, of the third doped region, under the second sidewall of the third doped region;

the first sidewall of the trench isolation structure extends from a second sidewall of the trench isolation structure to a third sidewall, of the trench isolation structure, under the second sidewall of the trench isolation structure; and a first distance between the third sidewall of the third doped region and a surface of the semiconductor body is between about a hundredth to about a fifth of a second distance between the third sidewall of the trench isolation structure and the surface of the semiconductor body.

20. The semiconductor device of claim 19, wherein:

a first concentration of first dopants of the second conductivity type in the third doped region is greater than a second concentration of second dopants of the second conductivity type in the second doped region.

* * * * *